US012666548B2

(12) United States Patent
Latimer et al.

(10) Patent No.: US 12,666,548 B2
(45) Date of Patent: Jun. 23, 2026

(54) CAPACITOR BANK ASSEMBLY FOR DEVICES USED IN AN AFTERTREATMENT SYSTEM

(71) Applicant: Cummins Emission Solutions Inc., Columbus, IN (US)

(72) Inventors: Jarius Elijah Latimer, Columbus, IN (US); Kyle Robert Fath, Greenwood, IN (US); Daniel Edward Novreske, Columbus, IN (US); Chad Carius, Elizabethtown, IN (US)

(73) Assignee: Cummins Emission Solutions Inc., Columbus, IN (US)

( * ) Notice: Subject to any disclaimer, the term of this patent is extended or adjusted under 35 U.S.C. 154(b) by 223 days.

(21) Appl. No.: 18/679,982

(22) Filed: May 31, 2024

(65) Prior Publication Data

US 2025/0374444 A1      Dec. 4, 2025

(51) Int. Cl.
| | |
|---|---|
| *H05K 5/00* | (2025.01) |
| *H01G 2/06* | (2006.01) |
| *H01G 2/10* | (2006.01) |
| *H05B 1/02* | (2006.01) |

(52) U.S. Cl.
CPC ........... *H05K 5/0056* (2013.01); *H01G 2/065* (2013.01); *H01G 2/103* (2013.01); *H01G 2/106* (2013.01); *H05K 5/0052* (2013.01); *H05K 5/006* (2013.01); *H05B 1/0236* (2013.01)

(58) Field of Classification Search
CPC .... H05K 5/0056; H05K 5/0052; H05K 5/006; H01G 2/065; H01G 2/103; H01G 2/106; H05B 1/0236

USPC ........................................................ 361/763
See application file for complete search history.

(56) References Cited

U.S. PATENT DOCUMENTS

2016/0126706 A1* 5/2016 Melchor Saucedo ....................... H05K 5/0069 361/626

FOREIGN PATENT DOCUMENTS

| | | | |
|---|---|---|---|
| JP | 2009-253009 A | 10/2009 | |
| KR | 20140122537 A | 10/2014 | |

* cited by examiner

*Primary Examiner* — Binh B Tran

(74) *Attorney, Agent, or Firm* — Foley & Lardner LLP

(57) ABSTRACT

A capacitor bank assembly includes a housing assembly and an internal assembly. The housing assembly includes an upper cover and a lower cover. The upper cover defines a cavity. The lower cover is below the upper cover in a first direction. The lower cover includes a base plate, a first protrusion, and a second protrusion. The first protrusion and the second protrusion each extend from the base plate in the first direction towards the upper cover. The internal assembly includes a circuit board removably coupled to the upper cover and a plurality of capacitors. At least a portion of each of the capacitors extends within the cavity. The capacitor bank assembly further includes a first thermally conductive layer disposed between the circuit board and a first protrusion upper surface and a second thermally conductive layer disposed between the circuit board and a second protrusion upper surface.

27 Claims, 20 Drawing Sheets

DETAIL A

DETAIL B

DETAIL C

DETAIL C

DETAIL D

CAPACITOR BANK ASSEMBLY FOR DEVICES USED IN AN AFTERTREATMENT SYSTEM

TECHNICAL FIELD

The present application relates generally to a capacitor bank assembly for devices, such as high-voltage devices, used in an aftertreatment system of a vehicle.

BACKGROUND

For internal combustion engines, such as diesel engines, nitrogen oxide ($NO_x$) compounds may be emitted in exhaust. It may be desirable to reduce $NO_x$ emissions, for example, to comply with environmental regulations. To reduce $NO_x$ emissions, reductant may be injected into the exhaust by a reductant delivery system coupled to a dosing system and within a vehicle system. In the presence of a catalyst, such as a selective catalytic reduction (SCR) catalyst member, the reductant facilitates conversion of a portion of the exhaust into non-$NO_x$ emissions, such as nitrogen ($N_2$), carbon dioxide ($CO_2$), and water ($H_2O$), thereby reducing $NO_x$ emissions.

In some instances, the exhaust provided to the catalyst may be heated by a heater to keep the catalyst at a sufficiently high temperature to better facilitate the conversion of the exhaust. A heater control unit (HCU) may be configured to control such a heater. The HCU may operate as a high-voltage device. Protecting circuitry of the HCU from voltage spikes and current ripple may require providing a large amount of capacitance to the HCU.

SUMMARY

In one embodiment, a capacitor bank assembly includes a housing assembly and an internal assembly. The housing assembly includes an upper cover and a lower cover. The upper cover defines a cavity. The lower cover is below the upper cover in a first direction. The lower cover includes a base plate, a first protrusion, and a second protrusion. The base plate is removably coupled to the upper cover. The first protrusion extends from the base plate in the first direction towards the upper cover. The first protrusion has a first protrusion upper surface. The second protrusion extends from the base plate in the first direction towards the upper cover. The second protrusion has a second protrusion upper surface. The internal assembly is disposed between the upper cover and the lower cover. The internal assembly includes a circuit board and a plurality of capacitors. The circuit board is removably coupled to the upper cover. The capacitors are electrically connected to the circuit board in parallel. Each of the capacitors extends from the circuit board in the first direction. At least a portion of each of the capacitors extends within the cavity. The capacitor bank assembly further includes a first thermally conductive layer disposed between the circuit board and the first protrusion upper surface and a second thermally conductive layer disposed between the circuit board and the second protrusion upper surface.

In another embodiment, a capacitor bank assembly includes a housing assembly and an internal assembly. The housing assembly includes an upper cover and a lower cover. The upper cover includes a base portion and a raised portion. The base portion has a first upper surface and first lateral surfaces. The raised portion extends in a first direction from a portion of the first upper surface. The raised portion defines a cavity. The lower cover includes a base plate. The base plate is removably coupled to the upper cover. The internal assembly is disposed between the upper cover and the lower cover. The internal assembly includes a circuit board and a plurality of capacitors. The circuit board is disposed between the upper cover and the lower cover in the first direction. The capacitors are electrically connected to the circuit board in parallel. Each of the capacitors extends from the circuit board in the first direction. At least a portion of each of the capacitors extends within the cavity.

BRIEF DESCRIPTION OF THE DRAWINGS

The disclosure will become more fully understood from the following detailed description, taken in conjunction with the accompanying Figures, wherein like reference numerals refer to like elements unless otherwise indicated, in which.

Figure 1:
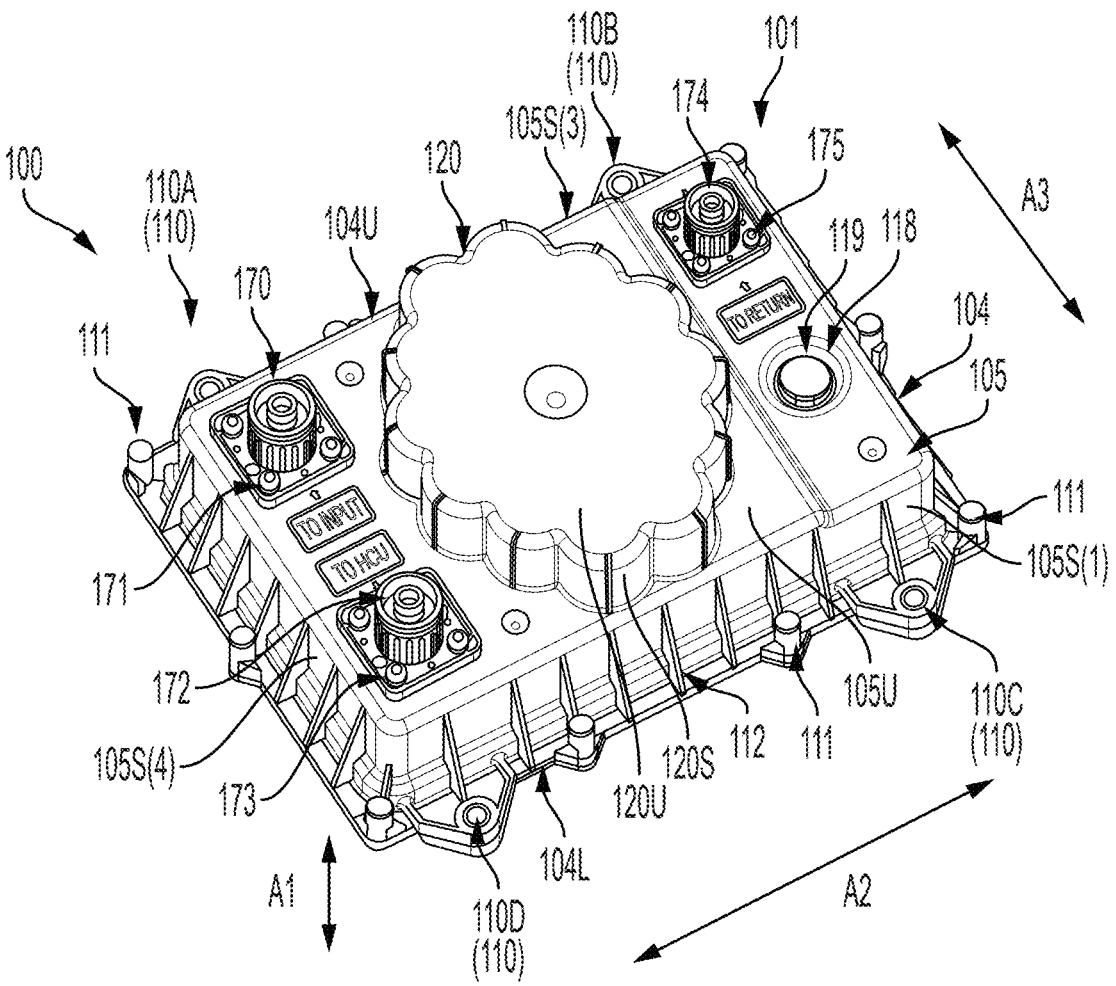
FIG. 1 illustrates a perspective top view of an example capacitor bank assembly, according to various embodiments.

It will be recognized that the Figures are schematic representations for purposes of illustration. The Figures are provided for the purpose of illustrating one or more implementations with the explicit understanding that the Figures will not be used to limit the scope or the meaning of the claims.

DETAILED DESCRIPTION

Following are more detailed descriptions of various concepts related to a capacitor bank assembly. The various concepts introduced above and discussed in greater detail below may be implemented in any of a number of ways, as the described concepts are not limited to any particular manner of implementation. Examples of specific implementations and applications are provided primarily for illustrative purposes.

I. Overview

Certain electrical components implemented in a vehicle require relatively higher voltage to maintain operation. Protecting such electrical components against electrical and environmental damages can improve the overall health and performance of the vehicle. In the present disclosure, a capacitor bank assembly is provided to mitigate voltage spikes and/or current ripple experienced by a high-voltage device in the aftertreatment system. For example, the capacitor bank assembly may include numerous capacitors electrically connected (e.g., mounted) in parallel to offer increased capacitance supplied by the high-voltage device for meeting the vehicle's initial demand for higher power (i.e., voltage) at start-up. At start-up, instead of relying on a power source, such as an alternator, which can take time to build up its supply, the capacitor bank assembly can be used as an energy storage to meet at least a portion of the initial demand. Accordingly, providing a capacitor bank assembly with increased capacitance (i.e., voltage) has at least the benefit of reducing voltage spikes experienced at the start-up of the vehicle. Additionally, various components of the capacitor bank assembly are configured to provide protection of the capacitors against damages caused by vibration, contamination, and/or fatigue during the operation of the vehicle. In this regard, such components of the capacitor bank assembly may be configured with suitable structural reinforcements.

In various embodiments, the high-voltage device is a heater control unit (HCU) of an aftertreatment system. In this regard, the capacitor bank assembly is configured to be electrically connected between a power source and the HCU. Generally, the HCU is a control unit designed to facilitate operating of an electrical heater (e.g., heating element, resistance heater, etc.) for heating exhaust provided to an SCR catalyst member to improve catalytic efficiency of the SCR catalyst member, especially at cooler temperatures. The HCU may require a power source (e.g., a direct current (DC) supply) of 48 volts (V) in some instances.

In some examples, the capacitor bank assembly may be utilized in vehicles, such as electric vehicles, with components that require additional capacitance, although the present disclosure does not limit the capacitor bank assembly to be used in any specific types of vehicles to with any specific types of high-voltage devices. For example, the capacitor bank assembly may be configured to be used with components of the vehicle outside of the aftertreatment system. However, for purposes of illustration only, the present disclosure discusses applications of the capacitor bank assembly in facilitating the operation of an HCU of an aftertreatment system.

II. Example Capacitor Bank Assembly

FIGS. 1-16, 19, and 20 illustrate an example capacitor bank assembly 100 in portions or in entirety. The capacitor bank assembly 100 includes a housing assembly 101 and an internal assembly 103. The housing assembly 101 is configured to enclose (e.g., house, surround, encapsulate, etc.) the internal assembly 103. The housing assembly 101 is configured to provide protection of the internal assembly 103 against factors that may potentially damage the internal assembly 103. For example, the housing assembly 101 is configured to provide protection against vibration. Vibration may be produced during operation of a vehicle (e.g., during movement of the vehicle, etc.). Mitigating transmission of vibrations to the internal assembly 103 is desirable to prolong desirable operation of the capacitor bank assembly 100.

Additionally or alternatively, the housing assembly 101 is configured to provide protection against contaminants including liquid matter, such as water and certain common automotive fluids, and/or solid matter, such as dust, present in a surrounding environment in which a vehicle containing the capacitor bank assembly 100 operates. Such contaminants, if present within the housing assembly 101, may cause corrosion, pitting, and/or other physical defects in components of the capacitor bank assembly 100, and may disrupt electrical performance of the components of the capacitor bank assembly 100. Accordingly, providing proper sealing in the housing assembly 101 may be desirable to maintain and/or prolong the desirable operations of the capacitor bank assembly 100. In some embodiments, the housing assembly 101 is configured to meet IP69 rating against various liquid and solid matters.

The housing assembly 101 includes an upper cover 104 and a lower cover 106. The lower cover 106 is disposed below the upper cover 104 in a first (i.e., a vertical) direction A1 that is substantially perpendicular to the lower cover 106 and along a height of the capacitor bank assembly 100. The upper cover 104 and the lower cover 106 are removably coupled to one another.

The upper cover 104 includes a base portion 105 and a raised portion 120 that extends in the first direction A1 from the base portion 105. The base portion 105 is removably coupled to the lower cover 106. The base portion 105 includes a first upper surface 105U and a plurality (e.g., four) of first lateral surfaces 105S(1), 105S(2), 105S(3), and 105S(4) (hereafter collectively referred to as first lateral surfaces 105S). The first lateral surfaces 105S may alternatively be referred to as the first walls 105S. The first upper surface 105U is substantially parallel to the lower cover 106. Each of the first lateral surfaces 105S adjoins a corresponding side of the first upper surface 105U. In some embodiments, each of the first lateral surfaces 105S is substantially planar. For example, each of the first lateral surfaces 105S does not include any curved portions.

Referring to FIGS. 1, 2, and 4-6, for example, the upper cover 104 further includes a plurality of housing fins 112 extending along each of the first lateral surfaces 105S in the first direction A1. In various embodiments, the housing fins 112 are configured to maintain an upright orientation of the first lateral surfaces 105S in the first direction A1, resulting in improved resistance to structural deformation in the upper cover 104. In some examples, structural deformation may be caused by external stresses including, but not limited to, vibration and fatigue associated with the operation of the capacitor bank assembly 100.

In some embodiments, the upper cover 104 is made from an engineering polymer (e.g., plastic, etc.), such as polybutylene terephthalate (PBT). In some embodiments, the upper cover 104 is made from PBT containing glass fibers (e.g., 30% glass-filled PBT). For embodiments in which the engineering polymer is a thermoplastic polymer, the housing fins 112 may also be configured to accommodate a molding process for fabricating the upper cover 104 from the thermoplastic polymer. In an example embodiment, the housing fins 112 on each of the lateral surfaces 105S are arranged substantially parallel to one another. By selecting an engineering polymer with high strength (e.g., tensile strength, yield strength, etc.), structural integrity of the upper cover 104 may be improved.

Figure 9:
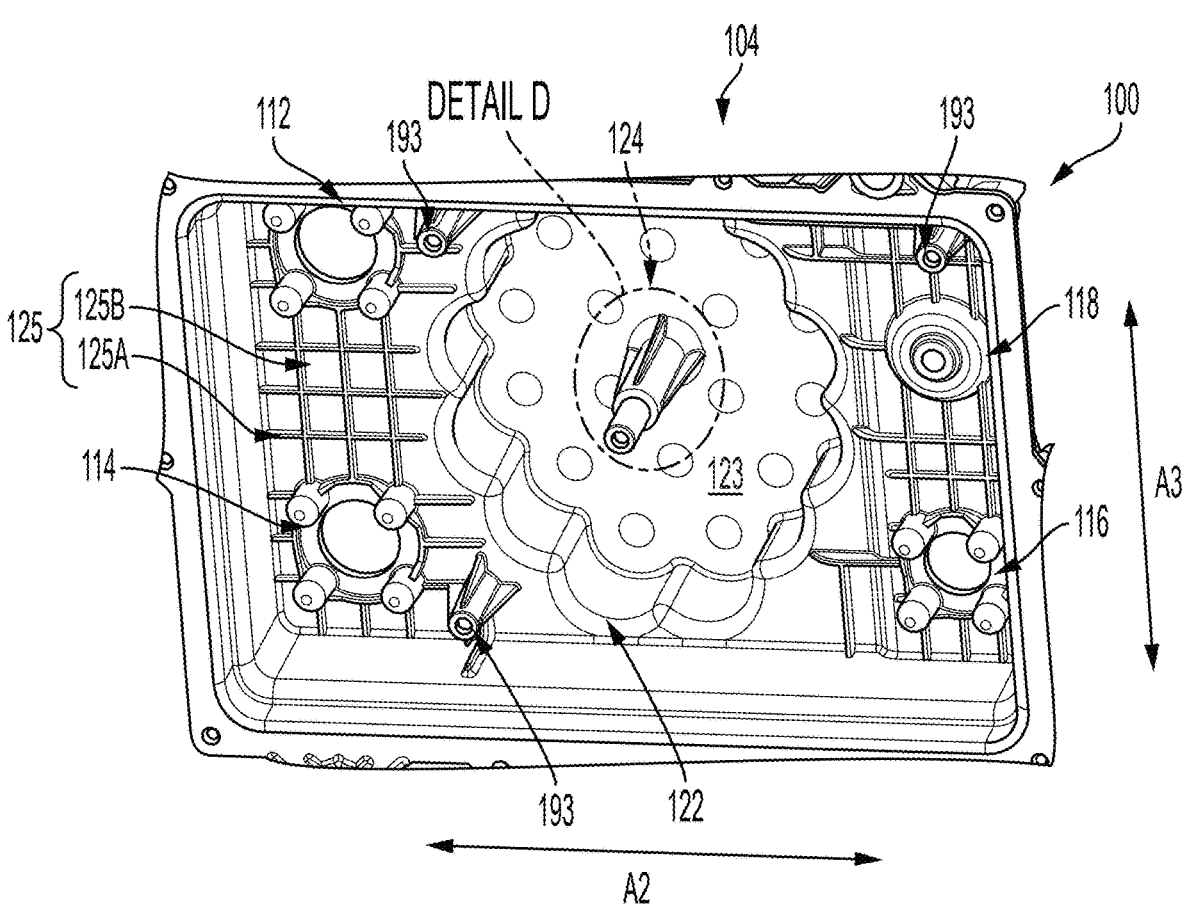
FIG. 9 illustrates an interior perspective view of an example upper cover of the example capacitor bank assembly of FIG. 1.

In some embodiments, referring to FIG. 9, the upper cover 104 further includes an upper ribbing structure 125 extending across an interior surface of the first upper surface 105U in both the second direction A2 and the third direction A3. Similar to the general function of the housing fins 112, the upper ribbing structure 125 provides bi-lateral structural reinforcement for the first upper surface 105U against external stresses, which may be caused by vibration and/or fatigue, for example. The upper ribbing structure 125 includes a plurality of upper longitudinal ribbing structures 125A extending in a second (e.g., lengthwise with respect to the upper cover 104) direction A2 perpendicular to the first direction A1. The upper ribbing structure 125 further includes a plurality of upper transverse ribbing structures 125B extending in a third (e.g., widthwise with respect to the upper cover 104) direction A3 perpendicular to the first direction A1 and the second direction A2. Each of the upper longitudinal ribbing structures 125A and each of the upper transverse ribbing structures 125B are positioned substantially perpendicular to one another.

Referring to FIGS. 1, 4, 5, 7, and 9, for example, the raised portion 120 extends in the first direction A1 from a portion of the first upper surface 105U. The raised portion 120 is configured to receive at least upper portions of the components, such as capacitors 142, of the internal assembly 103 enclosed within the housing assembly 101. The raised portion 120 includes a second upper surface 120U and a second lateral surface 120S. The second lateral surface 120S may be alternatively referred to as the second wall 120S. The second lateral surface 120S adjoins the second upper surface 120U along a perimeter of the second upper surface 120U.

Referring to FIG. 9, for example, the raised portion 120 defines a raised portion cavity 123. The cavity 123 is enclosed by the second upper surface 120U and the second lateral surface 120S. The cavity 123 is configured to receive the upper portions of the capacitors 142 enclosed with in the housing assembly 101. The second lateral surface 120S includes a plurality of curved portions 122 coupled to one another in sequence. In some embodiments, each of the curved portions 122 is configured to conform to a shape of one of the capacitors 142. In various embodiments, each of the curved portions 122 is configured to conform to and contact a capacitor lateral surface 142S (see FIG. 19, for example) of one of the capacitors 142. For embodiments in which the capacitors 142 each have a substantially cylindrical shape (see FIG. 5, for example), each of the curved portions 122 is thus configured to conform to a curvature of the substantially cylindrical shape. In addition, a shape of the second lateral surface 120S is configured to conform to a pattern 143 (see FIG. 16) of the arrangement of the capacitors 142.

By replacing planar portions having straight edges with the curved portions 122, stress and strain experienced by the raised portion 120 can be mitigated, leading to improved structural integrity in the raised portion 120. In addition, the curved portions 122 in the second lateral surface 120S allow the raised portion 120 to cradle (e.g., clasp, surround, etc.) the upper portions of the enclosed capacitors 142, thereby providing greater structural support for the capacitors 142 against tilting or swaying in in the second direction A2 and the third direction A3.

Referring to FIGS. 7-10, the upper cover 104 further includes a support pin 124. The support pin 124 extends in the first direction A1 from the raised portion 120 towards the lower cover 106. In various embodiments, the support pin 124 is integrally formed (e.g., molded, extruded, cast, etc.) with the raised portion 120.

Figure 8:
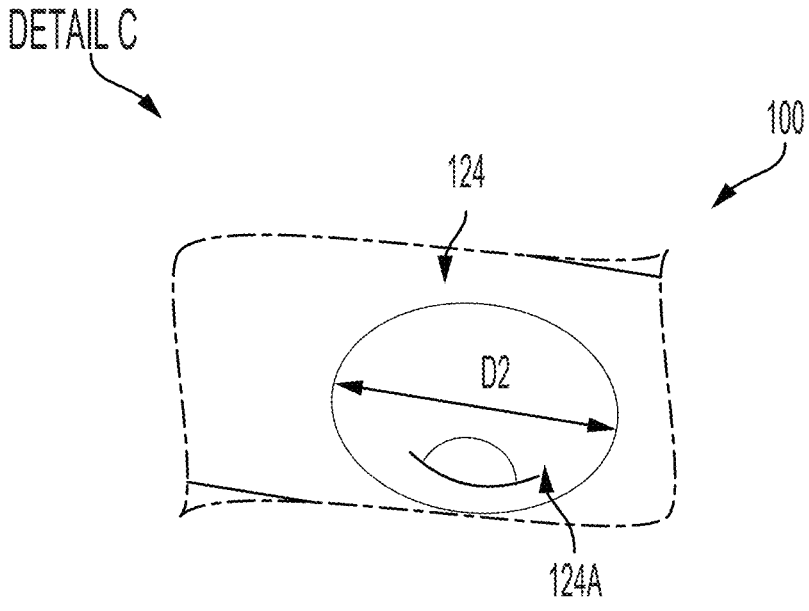
FIG. 8 illustrates a detailed view of DETAIL C in FIG. 7.
Figure 10:
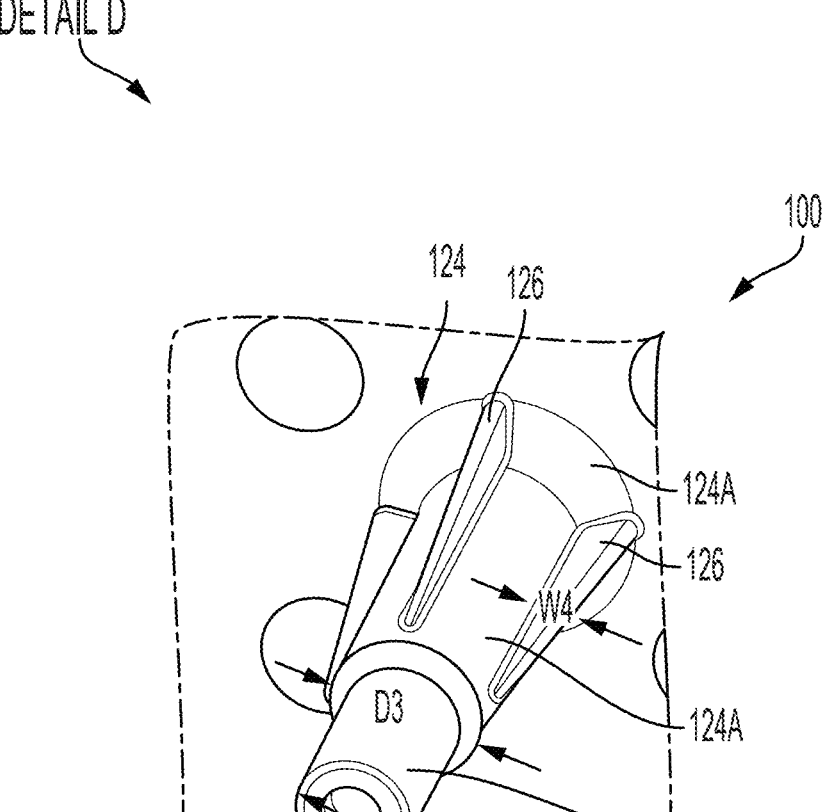
FIG. 10 illustrates a detailed view of DETAIL D in FIG. 9.

Referring to FIGS. 8 and 10, the support pin 124 includes an upper portion 124A extending from the raised portion 120 in the first direction A1. In some embodiments, the upper portion 124A is recessed from the raised portion 120 towards the lower cover 106. The upper portion 124A has a first diameter D2 measured at an upper end of the upper portion 124A in a plane of the second upper surface 120U. The upper portion 124A has a second diameter D3 measured at a lower end of the upper portion 124A opposite the upper end. The second diameter D3 is less than the first diameter D2.

Figure 11:
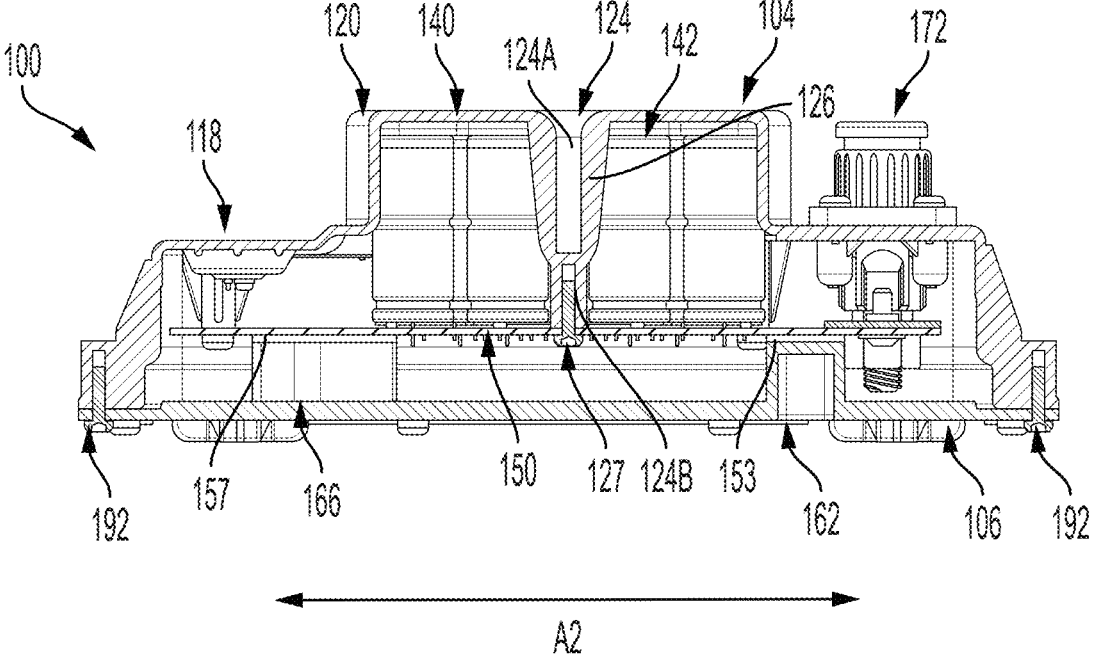
FIG. 11 illustrates a cross-sectional view of the example capacitor bank assembly of FIG. 1 taken along plane B-B in FIG. 5.

The support pin 124 also includes a lower portion 124B extending from the upper portion 124A towards the lower cover 106. Referring to FIG. 11, the lower portion 124B is coupled to a circuit board 130 of the internal assembly 103 using a fastener 127 (e.g., screw, pin, etc.). The lower portion 124B has a third diameter D4 that is less than the second diameter D3.

The support pin 124 further includes a plurality of ridges 126 protruding from the upper portion 124A. Each of the ridges 126 extends lengthwise in the first direction A1 (i.e., along the upper portion 124A) and radially from the upper portion 124A. Each of the ridges 126 has a width W4 that decreases from the upper portion 124A towards the lower portion 124B in the first direction A1. In various embodiments, the width W4 is configured to provide support for the upper portion 124 and the alignment of the capacitors 142. Additionally, the ridges 126 are configured to conform to the curvature of the capacitors 142, such that one of the capacitors 142 is cradled between each pair of the ridges 126. In this regard, the support pin 124 is surrounded by and in contact with a plurality of adjacently disposed capacitors 142. By securing the support pin 124 to the circuit board 130 of the internal assembly 103 using the fastener 127, the structural stability of the housing assembly 101 and the internal assembly 103 is improved. In addition, the support pin 124 may assist in an alignment of the upper cover 104 with the internal assembly 103 during an assembling process, thereby improving the ease of constructing the capacitor bank assembly 100.

Referring again to FIG. 1, the upper cover 104 further includes a plurality of mounting feet 110A, 110B, 110C, and 110D (e.g., mounting guides, etc.; collectively referred to as mounting feet 110). The mounting feet 110A and 110B are disposed along an upper edge 104U of the upper cover 104. The mounting feet 110C and 110D are disposed along a lower edge 104L of the upper cover 104. The upper edge 104U and the lower edge 104L each extend in the direction A2 and are separated from one another in the third direction A3. For example, the mounting feet 110A and 110D are separated from one another in the third direction A3, and the mounting feet 110B and 110C are separated from one another in the third direction A3.

Figure 4:
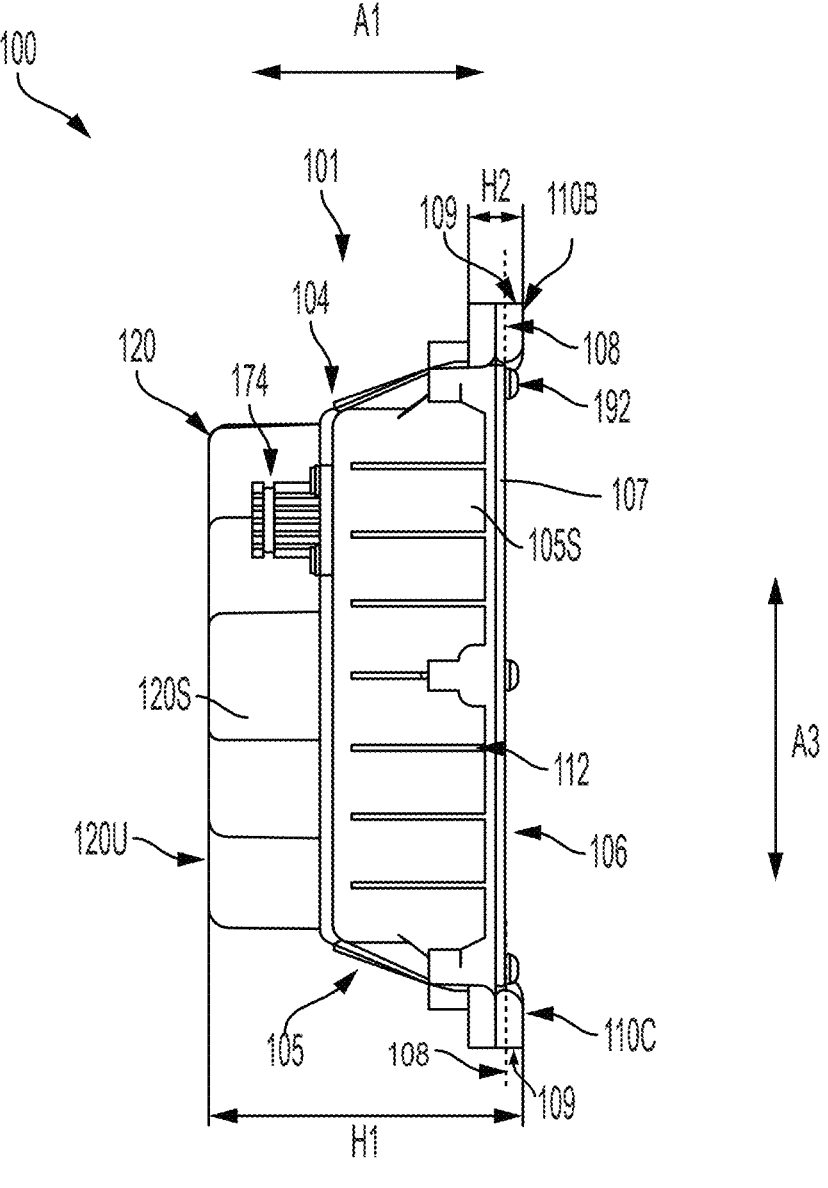
FIG. 4 illustrates a side view of the example capacitor bank assembly of FIG. 1.

In various embodiments, the mounting feet 110 are configured to fasten (e.g., attach, mount, etc.) the upper cover 104 to a support surface, such as a surface of a component of an aftertreatment system. As shown in FIG. 4, for example, each of the mounting feet 110 includes a protruding portion 109 that extends (e.g., protrudes, etc.) past an edge 108 of a base plate 107 of the lower cover 106 in the first direction A1. In this regard, when the assembled capacitor bank assembly 100 is placed on the support surface with the lower cover 106 facing the support surface, the protruding portion 109 of each of the mounting feet 110 makes physical contact with the support surface, while the base plate 107 does not make physical contact with the support surface but is suspended over the support surface. The capacitor bank assembly 100 can be fastened to the support surface by providing a fastener through each of the mounting feet 110. By fastening the upper cover 104 to the support surface through the mounting feet 110, weight of the capacitor bank assembly 100 is partially carried by the support surface, thereby reducing the amount of stress exerted on the lower cover 106.

In some embodiments, the mounting feet 110 are configured to assist in installing the capacitor bank assembly 100 in a vehicle. For example, referring to FIG. 3, the mounting feet 110A and 110B are separated by a first separation distance L1, and the mounting feet 110C and 110D are separated by a second separation distance L2. To ensure the upper cover 104 and the lower cover 106 are aligned in the correct orientation, the second separation distance L2 is configured to be different from the first separation distance L1, rendering the upper edge 104U to be easily distinguishable from the lower edge 104L. In the depicted embodiment, the first separation distance L1 is less than the second separation distance L2, although the present disclosure is not limited as such.

Figure 5:
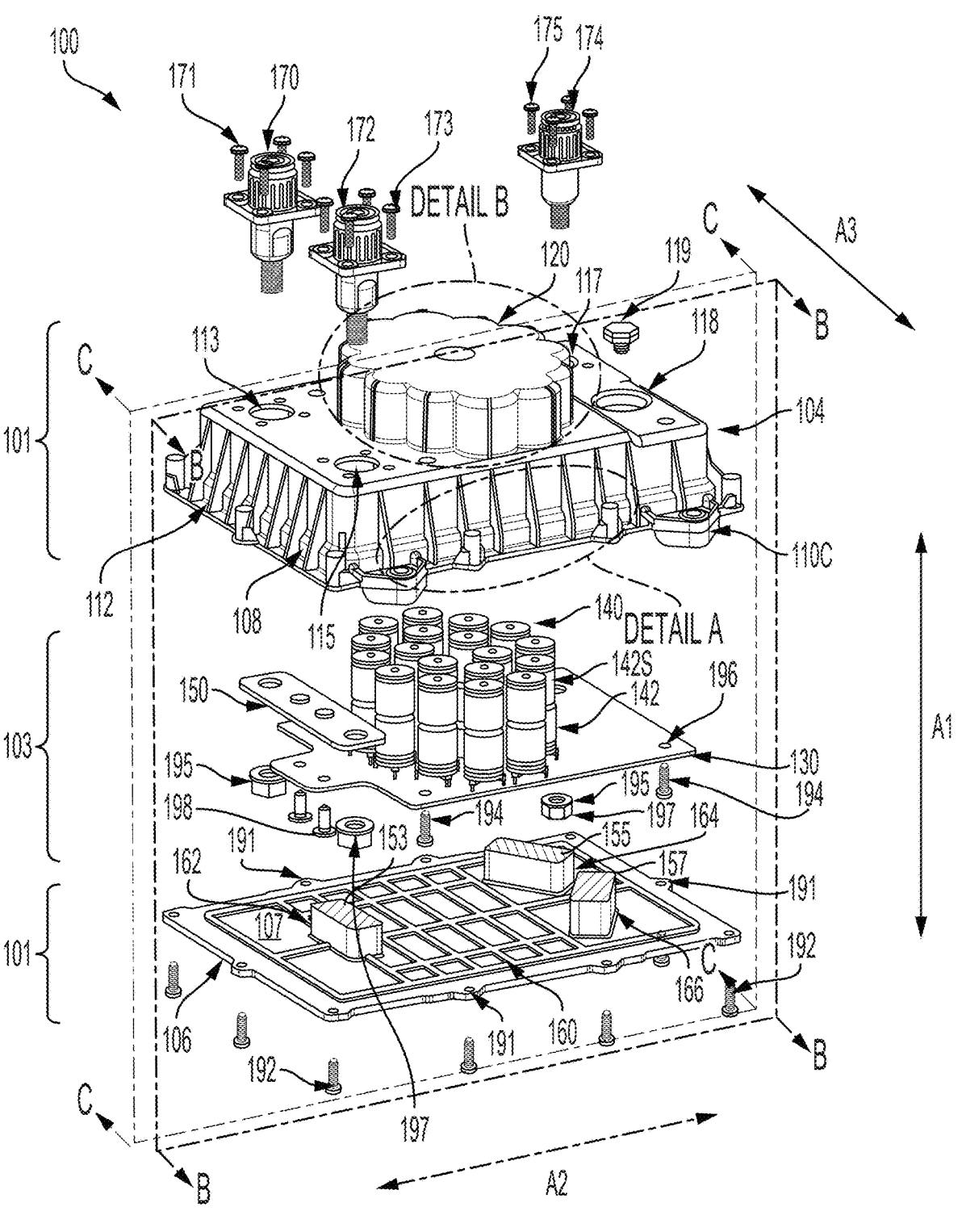
FIG. 5 illustrates an exploded perspective view of the example capacitor bank assembly of FIG. 1.
Figure 6:
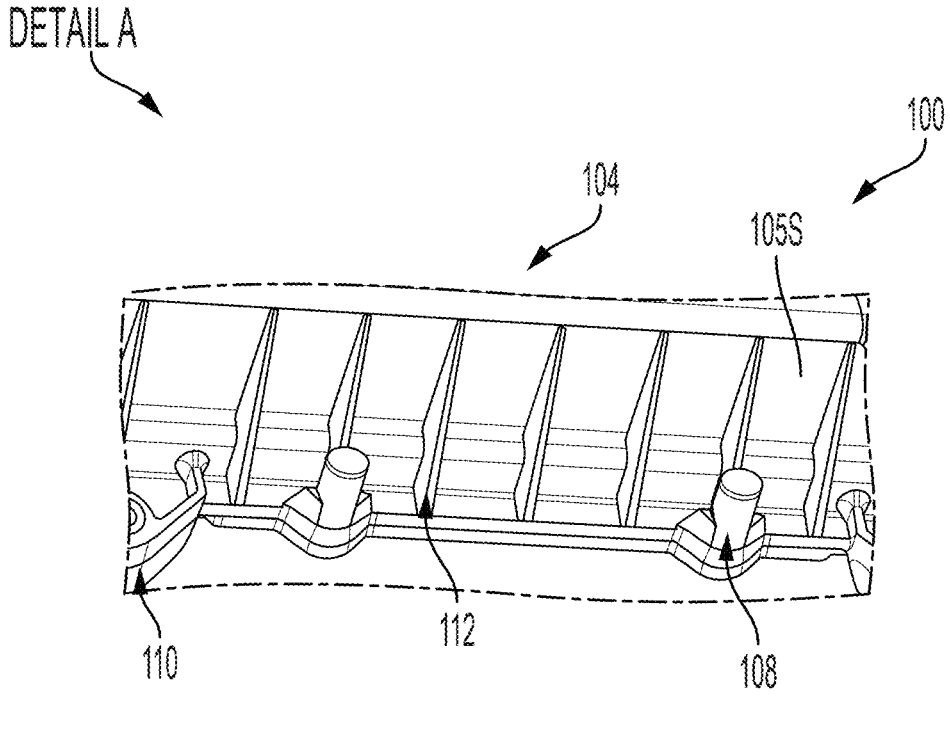
FIG. 6 illustrates a detailed view of DETAIL A in FIG. 5.
Figure 7:
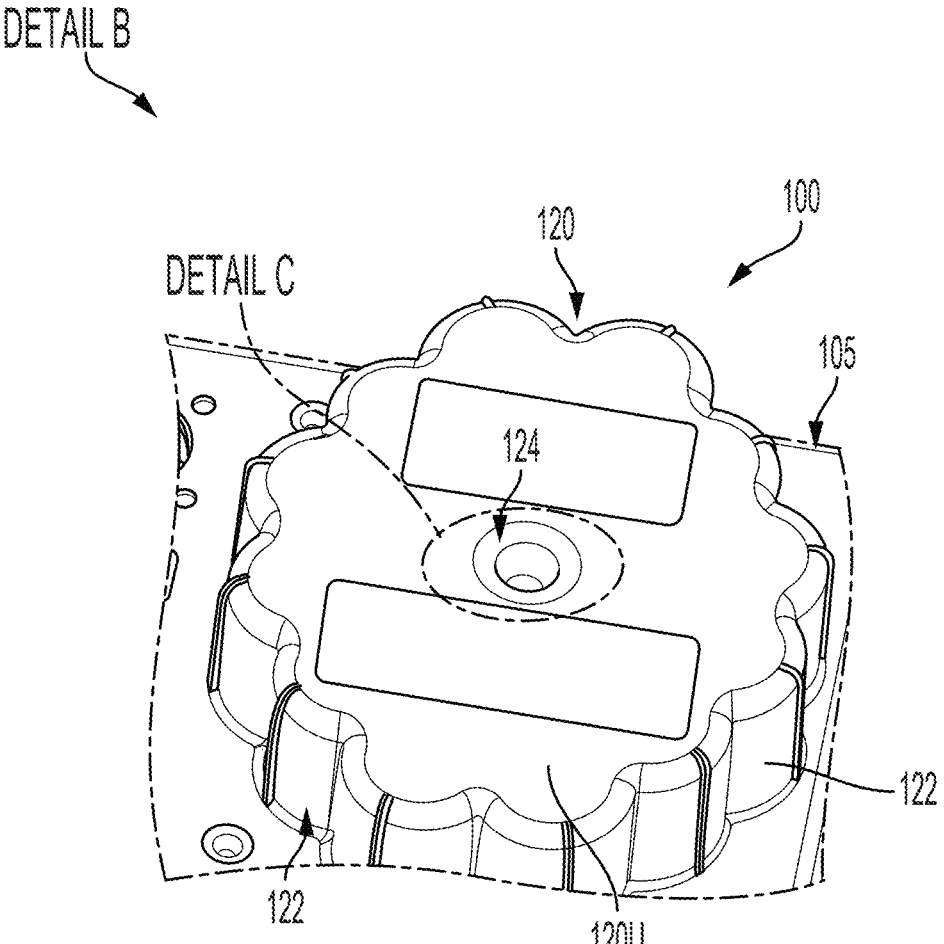
FIG. 7 illustrates a detailed view of DETAIL B in FIG. 5.

Referring to FIGS. 1 and 5, the upper cover 104 further includes a plurality of outer screw housings 111 distributed along a perimeter of the first lateral surfaces 105S. The outer screw housings 111 are integrally formed with the upper cover 104. The capacitor bank assembly 100 includes a plurality of screws 192 configured to couple the lower cover 106 to the upper cover 104. Each of the outer screw housings 111 is configured to receive a corresponding one of the screws 192 extending through the lower cover 106 (e.g., through one of outer screw openings 191 formed in the lower cover 106), as depicted in FIG. 5. In various embodiments, the outer screw housings 111 are configured to protect the screws 192 from damages (e.g., corrosion, etc.) caused by liquid matter and/or solid matter, which may be desirable for providing proper sealing in the housing assembly 101. In some embodiments, the configurations and locations of the outer screw housings 111 render the housing assembly 101 in compliance with the IP69 rating. In some embodiments, the outer screw housings 111 are positioned equidistant from one another along the perimeter of the first lateral surfaces 105S. In some embodiments, an adhesive sealant is applied to fill any space between the lower edge 104L of the upper cover 104 and the base plate 107. The adhesive sealant is configured to provide at least barrier against contaminants (e.g., liquids, dust particles, etc.) to dampen vibration of the upper cover 104 and the lower cover 106 during operation of the vehicle.

Referring to FIG. 9, the upper cover 104 also includes a plurality of inner screw housings 193 extending from the interior surface of the first upper surface 105U in the first direction A1. The inner screw housings 193 are integrally formed with the upper cover 104. The capacitor bank assembly 100 includes a plurality of screws 194 configured to fasten the circuit board 130 to the upper cover 104. Each of the inner screw housings 193 is configured to receive a corresponding one of the screws 194 extending through one of screw openings 196 formed in the circuit board 130, as depicted in FIG. 5. In this configuration, the circuit board 130 is removably coupled (e.g., fastened, attached) to the upper cover 104 by the screws 194 and therefore does not rely on or require components of the lower cover 106 for load-bearing purposes.

Referring to FIG. 5, the upper cover 104 also includes a plurality of openings configured to receive connectors designed to be electrically or physically coupled to components of the internal assembly 103. For example, the upper cover 104 includes a first opening 113 and a second opening 115 disposed adjacent to the raised portion 120 in the second direction A2. The first opening 113 and the second opening 115 are separated from one another in the third direction A3. The upper cover 104 further includes a third opening 117 disposed adjacent to the raised portion 120 and separated from the first opening 113 in the second direction A2.

The upper cover 104 further includes a fourth opening 118 disposed adjacent to the raised portion 120 and separated from the second opening 115 in the second direction A2. The fourth opening 118 is configured as a vent (e.g., an air vent, etc.) for providing a path for heat dissipation from the internal assembly 103. The housing assembly 101 includes a vent insert 119 coupled to and partially covering the fourth opening 118, allowing the heat generated by the capacitors 142 to dissipate from the fourth opening 118 and serving as a barrier for keeping fluids and other environmental particles (e.g., dirt and dust particles) out of the internal assembly 103.

Referring to FIGS. 5, 15, 17, and 18 for example, the capacitor bank assembly 100 includes an input connector 170 configured to extend through the first opening 113 and couple to the upper cover 104 by screws 171. The input connector 170 is further configured to physically couple an input terminal 152 of the internal assembly 103 with a power source 210, thereby establishing electrical connection between the input terminal 152 and the power source 210. The capacitor bank assembly 100 also includes an output connector 172 configured to extend through the second opening 115 and couple to the upper cover 104 by screws 173. The output connector 172 is further configured to physically couple an output terminal 154 of the internal assembly 103 with an output device 220 (e.g., an HCU), thereby establishing electrical connection between the output terminal 154 and the output device 220.

As will be described in detail below, the input terminal 152 and the output terminal 154 are disposed on a busbar 150, which is removably and electrically (or physically) coupled to the circuit board 130 of the internal assembly 103. In this configuration, the input connector 170 is electrically connected to both the input terminal 152 and the circuit board 130 and removably couples the upper cover 104 to the circuit board 130. Similarly, the output connector 172 is electrically connected to both the output terminal 154 and the circuit board 130 and removably couples the upper cover 104 to the circuit board 130. Furthermore, the capacitor bank assembly 100 includes a return/ground connector 174 configured to extend through the third opening 117 and to electrically connect the circuit board 130 of the internal assembly 103 to return/ground 230 (e.g., electrical ground). Accordingly, the circuit board 130 is removably coupled to the upper cover 104 via the input connector 170, the output connector 172, the return/ground connector 174, and the screws 194.

In some embodiments, each of the input connector 170 and the output connector 172 is configured for use with a wire having a gauge size (i.e., a cross-sectional area) of 95 mm². The return/ground connector 174 is configured for use with a wire having a gauge size of 50 mm².

In some embodiments, an adhesive sealant is applied between each of the input connector 170, the output connector 172, and the return/ground connector 174 and their respective openings in the upper cover 104. For example, the adhesive sealant is applied between the input connector 170 and the first opening 113, the adhesive sealant is applied between the output connector 172 and the second opening 115, and the adhesive sealant is applied between the return/ground connector 174 and the third opening 117. The adhesive sealant provides at least the benefit of reducing the effect of vibration on each of the input connector 170, the output connector 172, and the return/ground connector 174.

Figure 3:
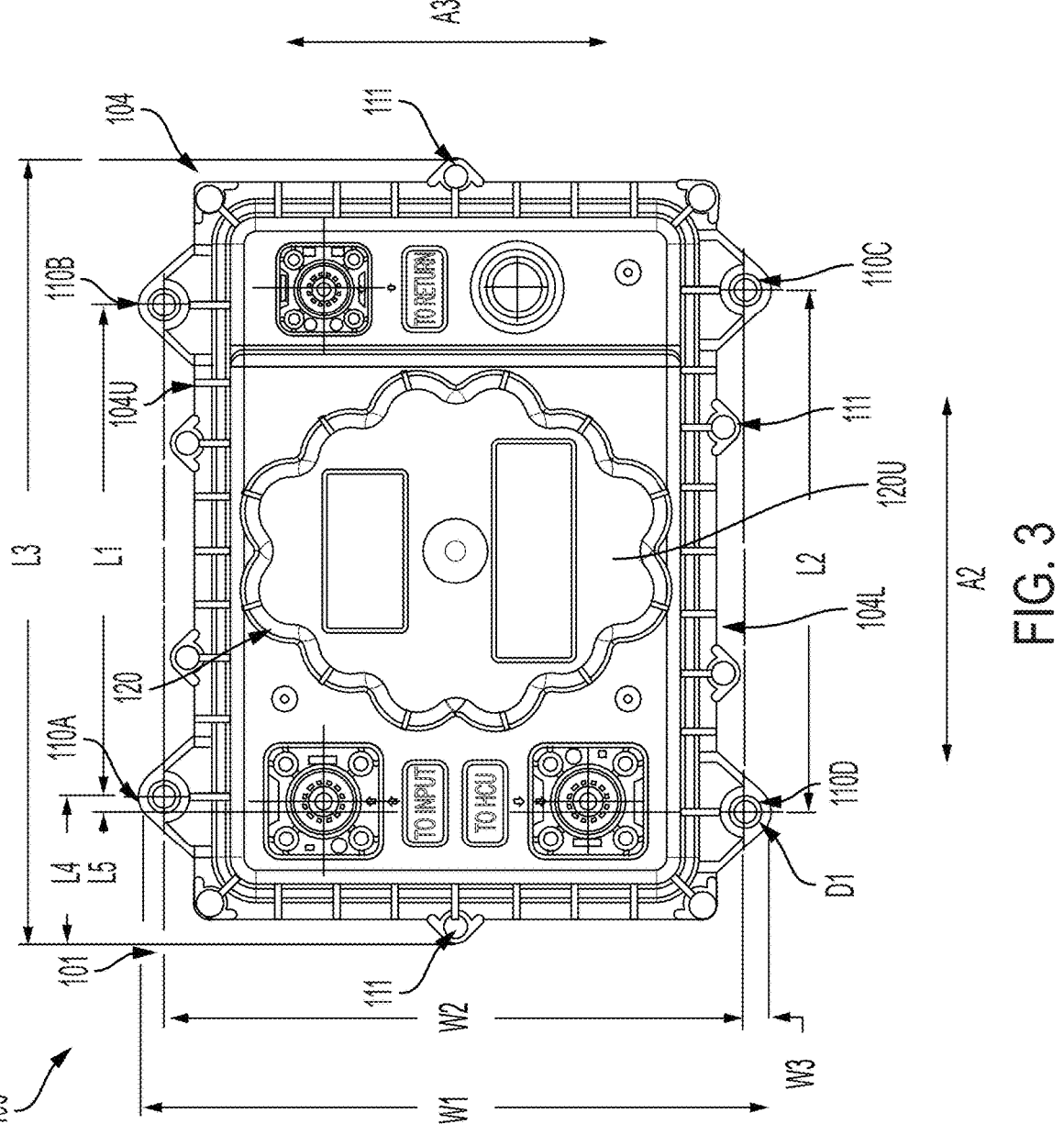
FIG. 3 illustrates a top view of the example capacitor bank assembly of FIG. 1.

In some embodiments, referring to FIG. 3, the separation distance L1 extending between the mounting feet 110A and 110B along the upper edge 104U is in a range of approximately 152 mm to approximately 168 mm, such as approximately 160 mm. In some embodiments, the separation distance L2 extending between the mounting feet 110C and 110D along the lower edge 104L is in a range of approximately 161.5 mm to approximately 178.5 mm, such as approximately 170 mm. In some embodiments, a separation distance L3 extending between two farthest outer screw housings 111 separated in the second direction A2 is in a range of approximately 241.8 mm to approximately 267.2 mm, such as approximately 254.5 mm. In some embodiments, a separation distance L4 extending between one of the outer screw housings 111 and one of the mounting feet 110 in the second direction A2 is in a range of approximately 44.9 mm to approximately 49.7 mm, such as approximately 47.3 mm. In some embodiments, a separation distance L5 extending between a center of the mounting foot 110A (or the mounting foot 110D) and a center of the first opening 113 (or the second opening 115) in the second direction A2 is in a range of approximately 4.8 mm to approximately 7.5 mm, such as approximately 5.0 mm.

Still referring to FIG. 3, in some embodiments, a separation distance W1 extending between an upper edge of the mounting foot 110A and a lower edge of the mounting foot 110D in the third direction A3 is in a range of approximately 194.0 mm to approximately 214.4 mm, such as approximately 204.2 mm. In some embodiments, a separation distance W2 extending between a center of the mounting foot 110A and a center of the mounting foot 110D in the third direction A3 is in a range of approximately 178.8 mm to approximately 197.6 mm, such as approximately 188.2 mm. In some embodiments, a portion of each of the mounting feet 110 has a radius in a range of approximately 6.5 mm to approximately 7.4 mm, such as approximately 6.9 mm.

Referring to FIG. 4, in some embodiments, a separation distance H1 extending between the second upper surface 120U and the base plate 107 of the lower cover 106 in the first direction A1 is in a range of approximately 81.5 mm to approximately 90.1 mm, such as approximately 85.8 mm. In some embodiments, a thickness H2 of each of the mounting feet 110 extending in the first direction A1 is in a range of approximately 14.3 mm to approximately 15.8 mm, such as approximately 15 mm.

Figure 2:
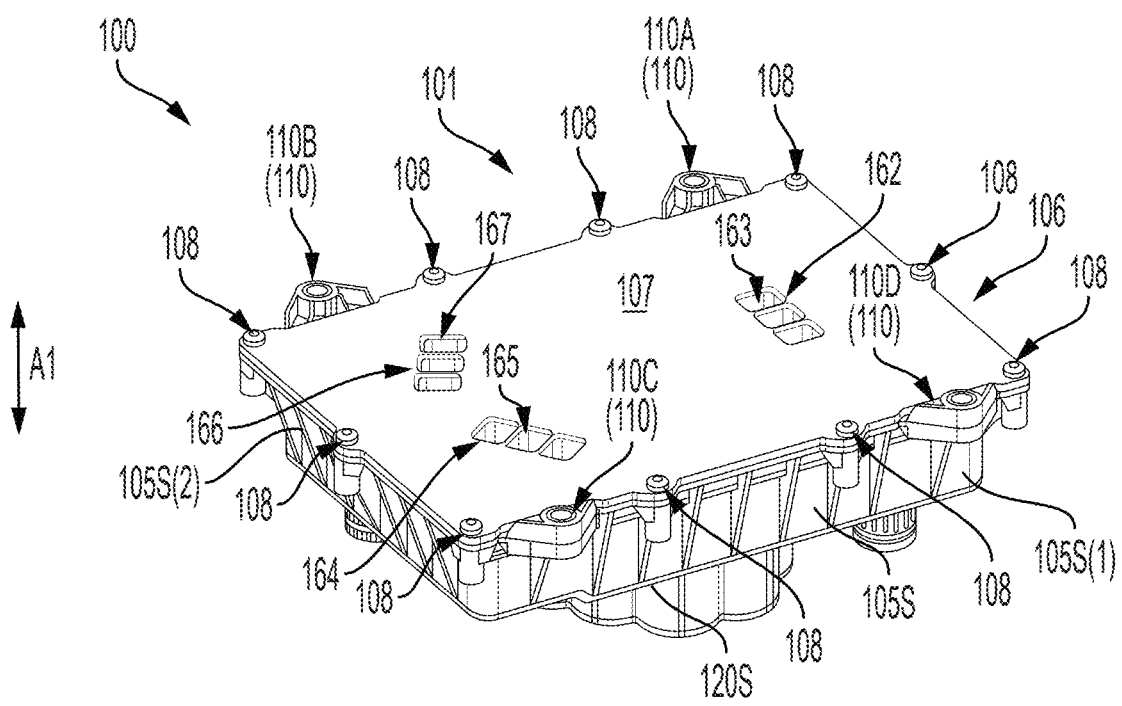
FIG. 2 illustrates a perspective bottom view of the example capacitor bank assembly of FIG. 1.

Referring to FIGS. 2 and 5, for example, the housing assembly 101 further includes the lower cover 106. The lower cover 106 is disposed below the upper cover 104 in the first direction A1. The lower cover 106 includes the base plate 107 removably coupled to the upper cover 104. The base plate 107 includes a plurality of the outer screw openings 191 at positions corresponding to positions of the respective outer screw housings 111. In this regard, the base plate 107 is removably coupled to the upper cover 104 by aligning each of the outer screw openings 191 with the corresponding outer screw housing 111 and providing one of the screws 192 to the outer screw housing 111 through the outer screw opening 191.

Figure 12:
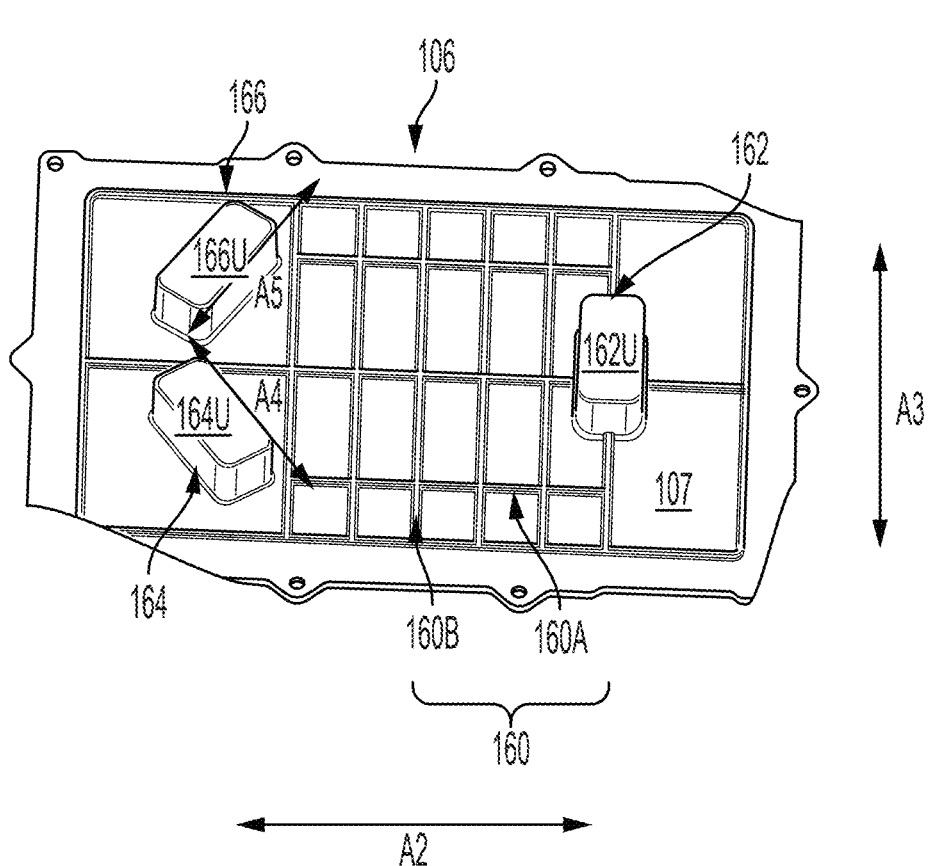
FIG. 12 illustrates a top view of an example lower cover of the example capacitor bank assembly of FIG. 1.
Figure 13:
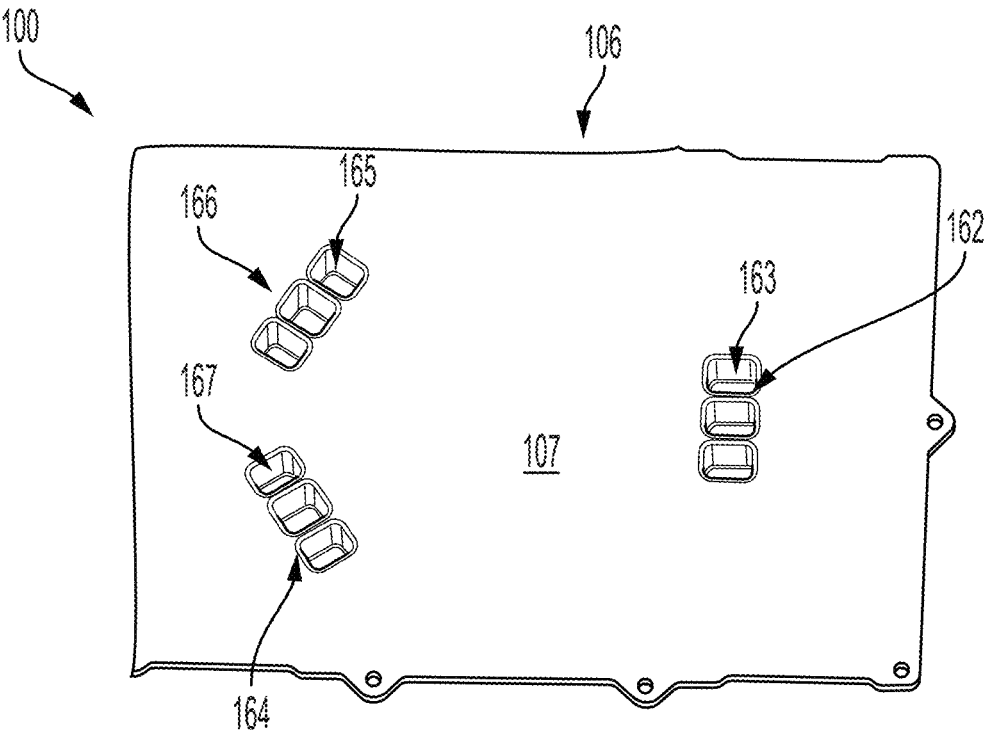
FIG. 13 illustrates a bottom view of the example lower cover of the example capacitor bank assembly of FIG. 1.
Figure 14:
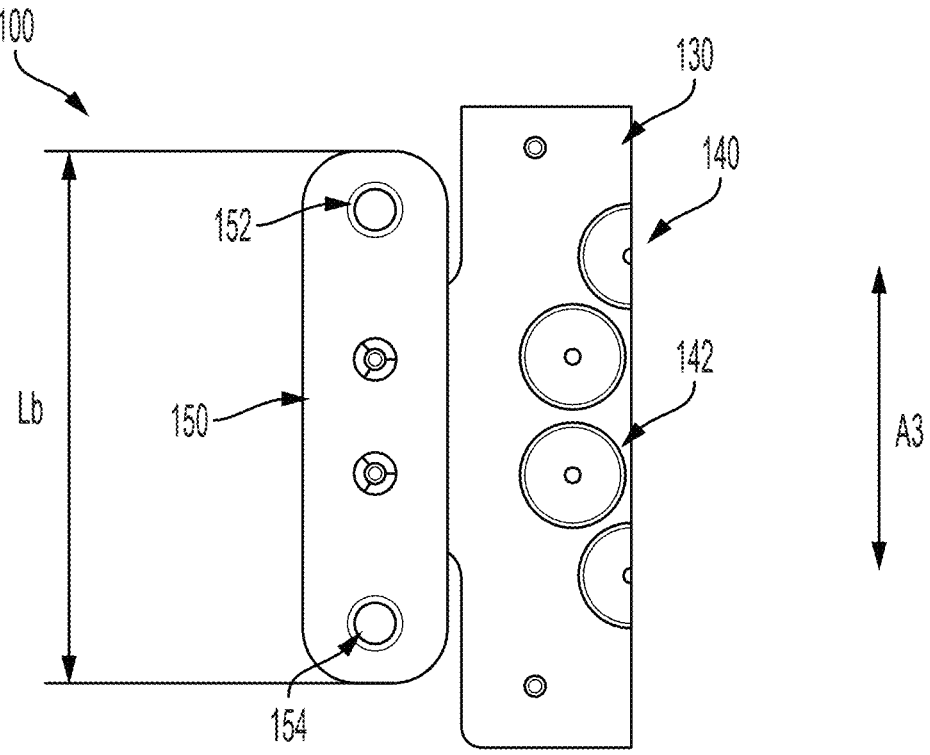
FIG. 14 illustrates a top view of a portion of an example internal assembly of the example capacitor bank assembly of FIG. 1.
Figure 15:
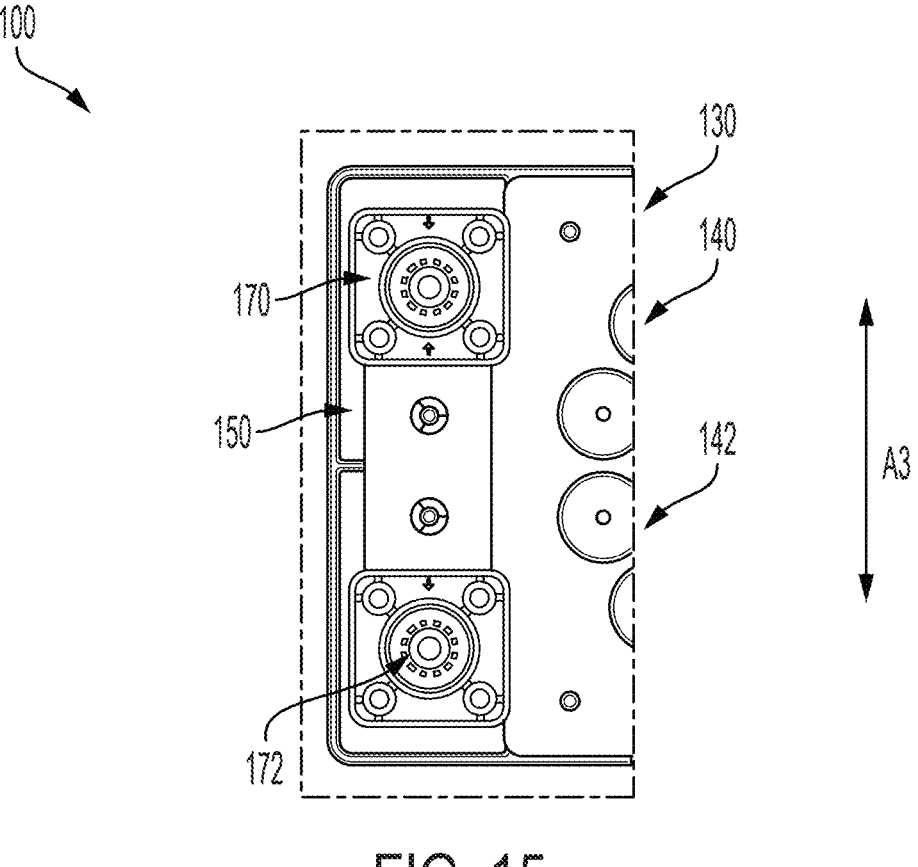
FIG. 15 illustrates a top view of a portion of the example capacitor bank assembly of FIG. 1.

Referring to FIG. 12, the lower cover 106 includes a lower ribbing structure 160 extending across an interior surface of the base plate 107. The lower ribbing structure 160 is configured to provide bi-lateral structural support for the lower cover 106 against vibration, deformation, and/or fatigue over time, similar in structure and function to the upper ribbing structure 125. For example, the lower ribbing structure 160 includes a plurality of lower longitudinal ribbing structures 160A extending in the second direction A2. The lower ribbing structure 160 further includes a plurality of lower transverse ribbing structures 160B extending in the third direction A3. Each of the lower longitudinal ribbing structures 160A and each of the lower transverse ribbing structures 160B are positioned substantially perpendicular to one another.

Referring to FIGS. 5 and 12, the lower cover 106 further includes a first protrusion 162 (e.g., fin, spacer, etc.), a second protrusion 164 (e.g., fin, spacer, etc.), and a third protrusion 166 (e.g., fin, spacer, etc.) each extending (e.g., protruding, etc.) height-wise from the base plate 107 towards the upper cover 104 in the first direction A1. Referring to FIG. 12, the first protrusion 162 includes a first protrusion upper surface 162U facing the upper cover 104. The second protrusion 164 includes a second protrusion upper surface 164U facing the upper cover 104. The third protrusion 166 includes a third protrusion upper surface 166U facing the upper cover 104.

In some embodiments, the first protrusion 162, the second protrusion 164, and the third protrusion 166 are integrally formed (e.g., machined, drawn, cast, molded, etc.) with the base plate 107. For example, referring to FIG. 13, the first protrusion 162, the second protrusion 164, and the third protrusion 166 may be formed as hollow, or substantially hollow, structures. In this regard, the first protrusion 162 may include one or more of first protrusion cavities 163, the second protrusion 164 may include one or more of second protrusion cavities 165, and the third protrusion 166 may include one or more of third protrusion cavities 167. The first protrusion cavities 163, the second protrusion cavities 165, and the third protrusion cavities 167 are configured to facilitate the dissipation and extraction of heat away from the circuit board 130. In addition, because the first protrusion 162, the second protrusion 164, and the third protrusion 166 are disposed between the base plate 107 (i.e., the lower cover 106) and the circuit board 130 of the internal assembly 103, physical space created therebetween may further facilitate the dissipation and extraction of heat, such as by thermal convection. Accordingly, specific positions of the first protrusion 162, the second protrusion 164, and the third protrusion 166 are configured to correspond to regions of the circuit board 130 where relatively greater amount of heat may be generated by the capacitors 142 during the operation of the capacitor bank assembly 100.

In various embodiments, the base plate 107 is made from a thermally conductive material, such as a metal, a metal alloy, or the like. In an example embodiment, the base plate 107 is made from aluminum.

In some embodiments, the first protrusion 162, the second protrusion 164, and the third protrusion 166 extend length-wise in different directions with respect to one another. For example, the first protrusion 162 is oriented lengthwise along the third direction A3 while the second protrusion 164 is oriented lengthwise along a fourth direction A4 and the third protrusion 166 is oriented lengthwise along a fifth direction A5. The fourth direction A4 and the fifth direction A5 are each angled (e.g., non-parallel, etc.) with respect to the third direction A3. In some embodiments, the fourth direction A4 and the fifth direction A5 are oriented symmetrically about the second direction A2, as depicted in FIG. 12.

Figure 19:
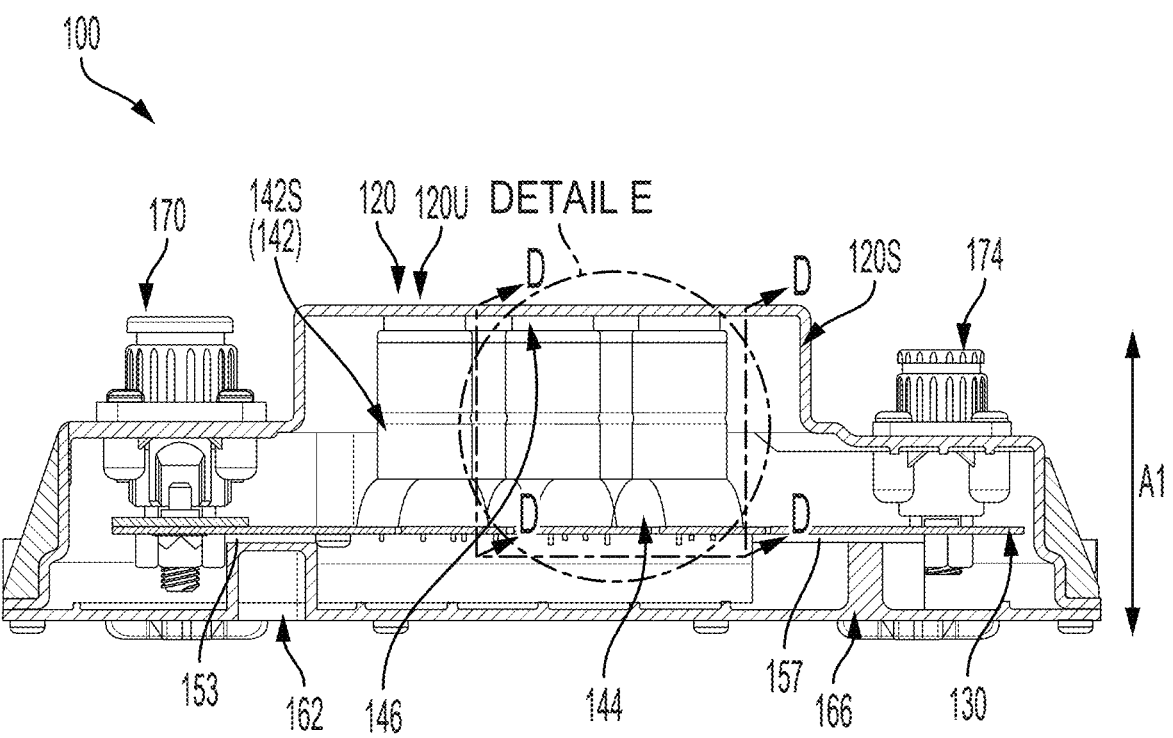
FIG. 19 illustrates a cross-sectional view of the example capacitor bank assembly of FIG. 1 taken along plane C-C in FIG. 5.

Referring to FIGS. 5, 11, and 19, for example, the capacitor bank assembly 100 includes a first thermally conductive layer 153 configured to separate the first protrusion 162 from the circuit board 130. In this configuration, the first thermally conductive layer 153 is in contact with the first protrusion upper surface 162U and the circuit board 130. Similarly, the housing assembly 101 also includes a second thermally conductive layer 155 configured to separate the second protrusion 164 from the circuit board 130. The second thermally conductive layer 155 is in contact with the second protrusion upper surface 164U and the circuit board 130. Furthermore, the housing assembly 101 includes a third thermally conductive layer 157 configured to separate the third protrusion 166 from the circuit board 130. In this configuration, the third thermally conductive layer 157 is in contact with the third protrusion upper surface 166U and the circuit board 130. In various embodiments, the first thermally conductive layer 153, the second thermally conductive layer 155, and the third thermally conductive layer 157 are each configured to facilitate movement of the circuit board relative to the first protrusion. For example, each of the first thermally conductive layer 153, the second thermally conductive layer 155, and the third thermally conductive layer 157 is configured to facilitate lifting (e.g., elevation, vertical separation) of the circuit board 130 and the upper cover 104 relative to the lower cover 106.

Furthermore, the first thermally conductive layer 153, the second thermally conductive layer 155, and the third thermally conductive layer 157 are configured to improve the dissipation of heat by increasing thermal conduction between the circuit board 130 (and various components disposed thereupon) and the lower cover 106. In various embodiments, the first thermally conductive layer 153, the second thermally conductive layer 155, and the third thermally conductive layer 157 are not air. In other words, space between the circuit board 130 and each of the first thermally conductive layer 153, the second thermally conductive layer 155, and the third thermally conductive layer 157 does not include an air gap.

In some embodiments, each of the first thermally conductive layer 153, the second thermally conductive layer 155, and the third thermally conductive layer 157 has a thickness along the first direction A1 of less than approximately 2.0 mm. In some embodiments, the first thermally conductive layer 153, the second thermally conductive layer 155, and the third thermally conductive layer 157 are made from a thermal paste. In some embodiments, the thermal paste includes a silicone-based thermally conductive material.

While the embodiments herein depict the first protrusion 162, the second protrusion 164, and the third protrusion 166, the present disclosure does not require all three protrusions be included in the lower cover 106. For example, in some embodiments, the lower cover 106 includes only two of the first protrusion 162, the second protrusion 164, and the third protrusion 166, such as only the first protrusion 162 and the second protrusion 164, only the first protrusion 162 and the third protrusion 166, or only the second protrusion 164 and the third protrusion 166. In various embodiments, the capacitor bank assembly 100 includes at least one of the three protrusions.

Referring to FIG. 5, for example, the capacitor bank assembly 100 further includes an internal assembly 103 enclosed (e.g., housed, etc.) within the housing assembly 101. The internal assembly 103 is disposed between the upper cover 104 and the lower cover 106 in the first direction A1.

The internal assembly 103 includes the circuit board 130. The circuit board 130 is removably coupled to the upper cover 104 by the screws 194 and extend in the second direction A2 and the third direction A3 over the first protrusion 162, the second protrusion 164, and the third protrusion 166. In this configuration, the circuit board 130 is disposed in a space separating the upper cover 104 from the first protrusion 162, the second protrusion 164, and the third protrusion 166. Referring to FIGS. 11 and 19, the circuit board 130 is in physical contact with the first thermally conductive layer 153, the second thermally conductive layer 155, and the third thermally conductive layer 157, which are disposed on the first protrusion upper surface 162U, the second protrusion upper surface 164U, and the third protrusion upper surface 166U, respectively. However, since the circuit board 130 is removably coupled to and structurally supported by the upper cover 104 via the input connector 170, the output connector 172, the return/ground connector 174, and the screws 194, the circuit board 130 does not rely on or require components of the lower cover 106 (e.g., the first protrusions 162, the second protrusions 164, and the third protrusions 166) for load-bearing purposes. In various embodiments, the first protrusions 162, the second protrusions 164, and the third protrusions 166 are not load-bearing and do not provide support of the circuit board 130 on the lower cover 106.

In some embodiments, the circuit board 130 is a printed circuit board (PCB). In some embodiments, the circuit board 130 includes multiple metallization (e.g., conductive) layers, where at least one of the metallization layers include conductive traces (e.g., interconnect structures, etc.) electrically connected to the power source 210 and at least one of the metallization layers include conductive traces (e.g., interconnect structures, etc.) electrically connected to the return/ground 230.

Figure 16:
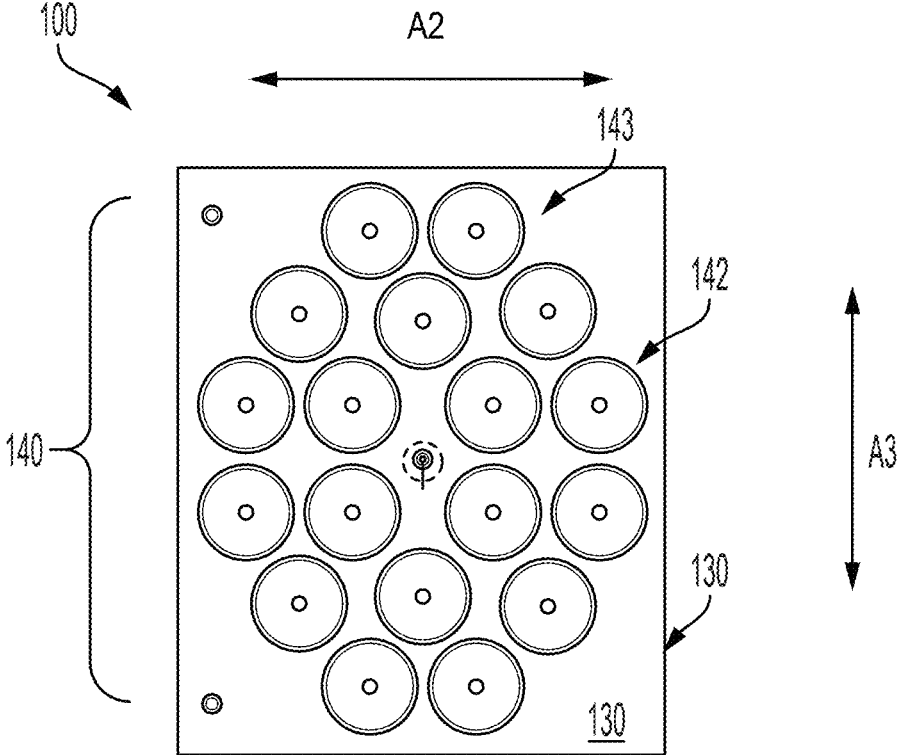
FIG. 16 illustrates a top view of a portion of the example internal assembly of the example capacitor bank assembly of FIG. 1.

Referring to FIGS. 5 and 16, for example, the internal assembly 103 includes a plurality of the capacitors 142, which are collectively referred to as a capacitor bank 140. The capacitors 142 are electrically connected to the circuit board 130 in parallel. Each of the capacitors 142 is electrically or physically coupled to the circuit board 130. Each of the capacitors 142 extends from the circuit board 130 towards the upper cover 104 in the first direction A1 such that each of the capacitors 142 is substantially perpendicular to the circuit board 130. Each of the capacitors 142 includes the capacitor lateral surface 142S. The capacitor lateral surface 142S extends from the circuit board 130 towards the upper cover 104 in the first direction A1.

In various embodiments, positioning each of the capacitors 142 to be substantially perpendicular to the circuit board 130 reduces an overall footprint of the capacitor bank 140, which results in a more compact design for the capacitor bank assembly 100. In addition, referring to FIG. 16, the pattern 143 is configured such that the capacitors 142 are arranged in a substantially close-packed structure (e.g., a "snowflake" structure from a top view) to further reduce the overall footprint of the capacitor bank 140. In some embodiments, the substantially close-packed structure allows more physical space in the capacitor bank assembly 100 to contain and route cables along the second direction A2. Arranging the capacitors 142 to be substantially perpendicular to the circuit board 130 and in a substantially close-packed pattern 143 also has the benefit of reducing (e.g., dampening, etc.) the effect of vibration on one or more of the capacitors 142 when the capacitor bank assembly 100 is implemented in a moving vehicle, for example.

At least a portion (e.g., the upper portion) of each of the capacitors 142 extends into the raised portion 120 such that the portion extends within the cavity 123. As described in detail above, each of the curved portions 122 in the second lateral surface 120S conforms to the shape (e.g., a curvature) of the capacitor lateral surface 142S of each of the capacitors 142 disposed along edges of the pattern 143. A dotted circle depicted in FIG. 16 indicates the portion of the circuit board 130 to which the fastener 127 is coupled. As described in detail above, the fastener 127 couples the lower portion 124B of the support pin 124 to the circuit board 130. In this regard, referring to FIG. 9, the second lateral surface 120S and the support pin 124 collectively cradle and stabilize the capacitor bank 140, thus providing structural support for the capacitor bank 140 against vibration, for example, when the capacitor bank assembly 100 is implemented in a moving vehicle.

In the depicted embodiments, the internal assembly 103 includes 18 capacitors 142 electrically connected in parallel. A number of the capacitors 142 included in the internal assembly 103 is not limited in the present disclosure and may be determined based on factors such as a voltage requirement (e.g., a maximum voltage held by all of the capacitors 142), a current requirement, the like, or combinations thereof, relevant to the intended applications of the capacitor bank assembly 100. For example, in the depicted embodiments, the internal assembly 103 includes 18 capacitors 142 such that the capacitor bank assembly 100 meets the voltage requirement of 48 V (e.g., holding a maximum voltage of 48 V) and a current requirement of 250 A for an application involving an HCU as the output device 220.

Figure 20:
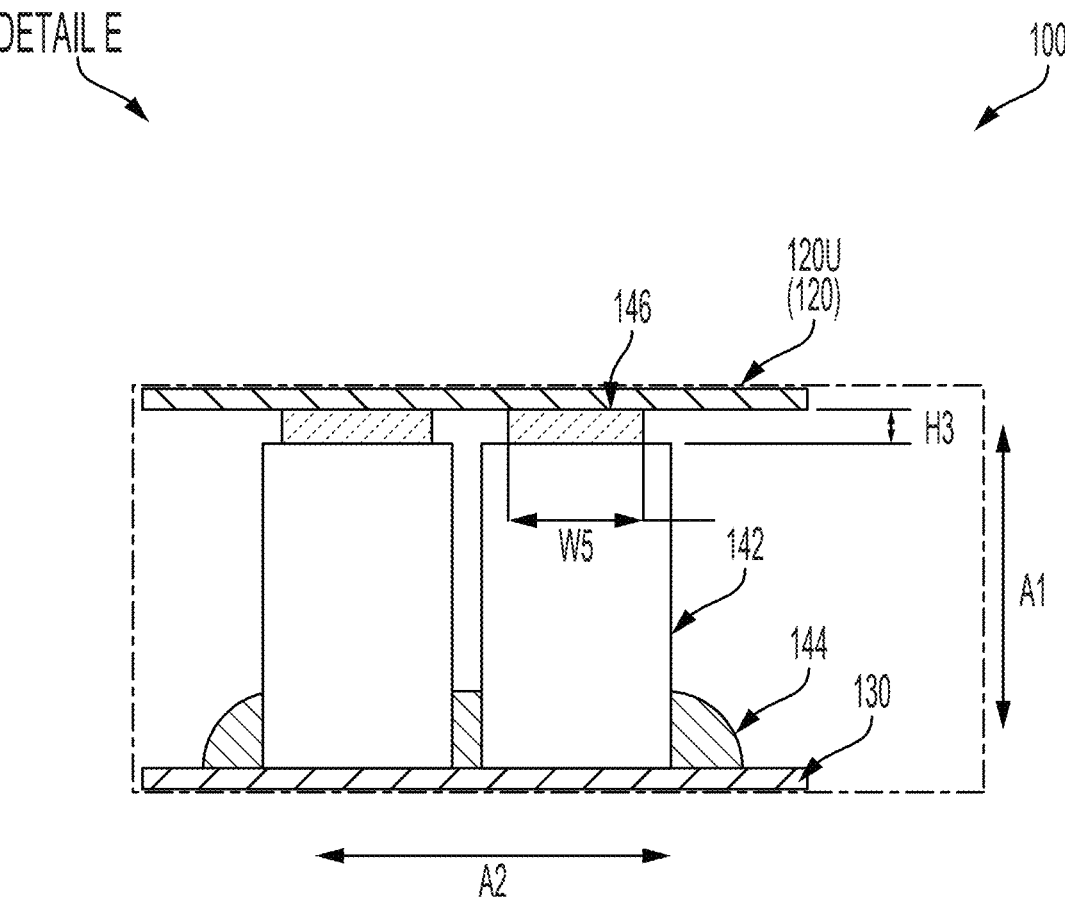
FIG. 20 illustrates a detailed view of DETAIL E taken along plane D-D in FIG. 19.

Referring to FIGS. 19 and 20, the capacitor bank assembly 100 further includes a plurality of lower buffer layers 144 each configured to couple (e.g., attach, adhere, bond, etc.) one of the capacitors 142 to the circuit board 130. Each of the lower buffer layers 144 surrounds a lower portion of the capacitor 142. For example, each of the lower buffer layers 144 couples a capacitor lateral surface 142S of the capacitor 142 to the circuit board 130. In this regard, the lower buffer layers 144 do not disrupt the electrical or physical connection between each of the capacitors 142 and the circuit board 130. In various embodiments, each of the lower buffer layers 144 is made from a first adhesive sealant. In some embodiments, the upper buffer layers 146 each have a thickness H3 extending in the first direction A1 that ranges from approximately 5.0 mm to approximately 7 mm and a width W5 extending in the second direction A2 that ranges from approximately 18 mm to approximately 20 mm.

The capacitor bank assembly 100 further includes a plurality of upper buffer layers 146 each configured to couple (e.g., attach, adhere, bond, etc.) one of the capacitors 142 to the second upper surface 120U of the raised portion 120. In various embodiments, each of the upper buffer layers 146 is interposed between the capacitor 142 and the second upper surface 120U, thereby physically separating each of the capacitors 142 from the second upper surface 120U. In various embodiments, each of the upper buffer layers 146 is made from a second adhesive sealant different from the first adhesive sealant. In various embodiments, while the first adhesive sealant and the second adhesive sealant are both silicon-based sealants, they differ with respect curing time. For example, one of the first adhesive sealant and the second adhesive sealant may require less time to cure, enabling assembly of the capacitor bank assembly 100 to proceed without significant interruption to allow for curing. The lower buffer layers 144 and the upper buffer layers 146 are configured to reduce (e.g., dampen, etc.) the vibration experienced by the capacitors 142 during the operation of a moving vehicle by attaching each one of the capacitors 142 to the circuit board 130 and the upper cover 104, thereby providing structural stability to the capacitors 142.

Referring to FIGS. 5, 14, 15, and 17, the internal assembly 103 further includes the busbar 150. The busbar 150 is physically coupled and electrically connected to the circuit board 130 in a region of the circuit board 130 adjacent to the capacitor bank 140. The busbar 150 includes the input terminal 152 (e.g., input contact, etc.) and the output terminal 154 (e.g., output contact, etc.). The busbar 150 extends lengthwise in the third direction A3 such that the input terminal 152 and the output terminal 154 are separated from one another in the third direction A3. In some embodiments, as depicted in FIG. 5, the busbar 150 is fastened to the circuit board using one or more busbar screws 198.

As described above, the input terminal 152 is electrically or physically coupled to the input connector 170 (e.g., via the busbar 150), which is further electrically connected to the power source 210 through the input connector 170, and the output terminal 154 is electrically or physically coupled to the output connector 172 (e.g., via the busbar 150), which is further electrically connected to the output device 220. In this regard, the busbar 150 forms a direct electrical and physical connection for the current to flow between the input terminal 152 and the output terminal 154, and between each of the input terminal 152 and the output terminal 154 and the capacitor bank 140. The busbar 150 is generally made from an electrically conductive material, such as a metal, a metal alloy, or the like. In some embodiments, the busbar 150 is made from nickel-plated copper. In some embodiments, it is desirable in some instances to reduce or minimize a length Lb of the busbar 150 to reduce the dissipation of heat generated by the busbar 150 as the current flows through it. In some embodiments, as depicted in FIG. 5, the input connector 170, the output connector 172, and the return/ground connector 174 are each fastened to the busbar 150 using a plurality of nuts 195 and washers 197.

Figure 17:
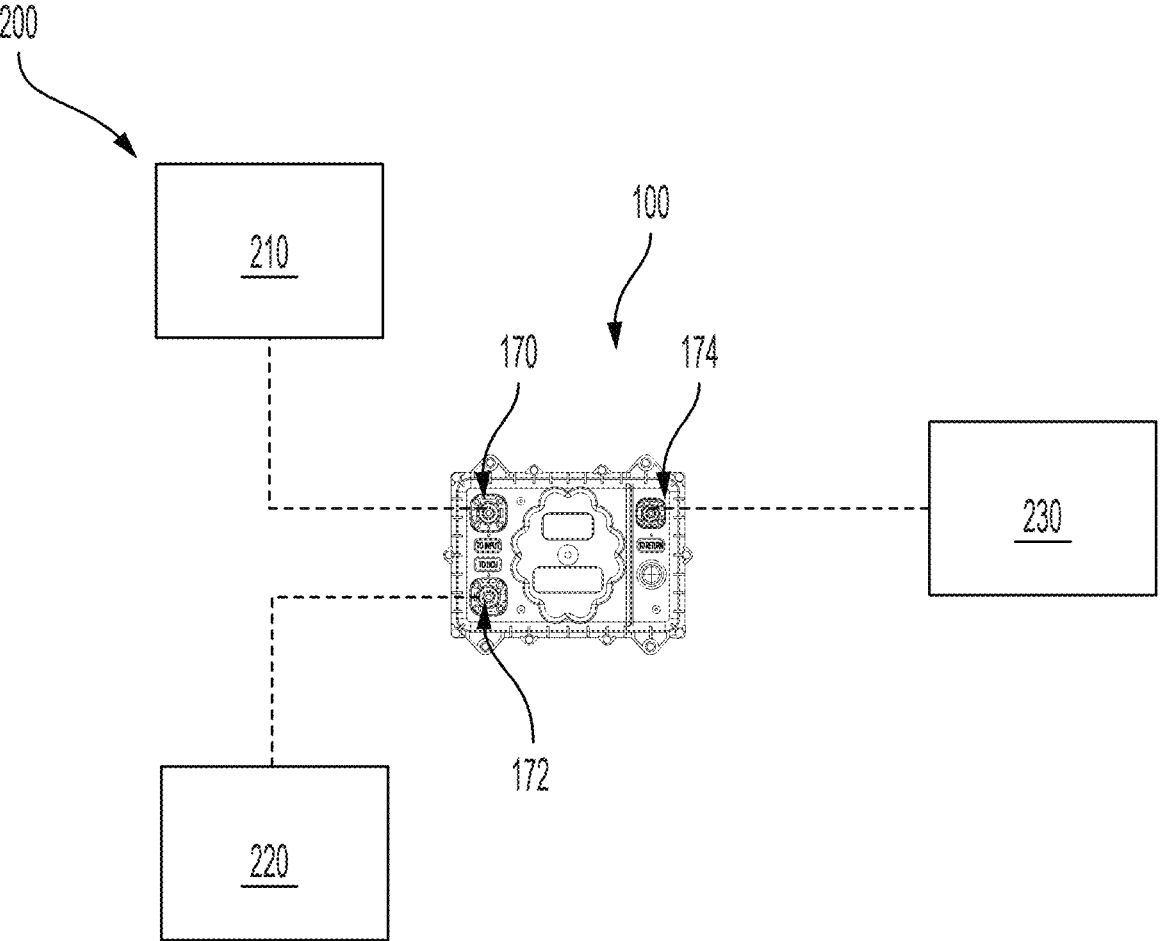
FIG. 17 illustrates a block diagram of an example system including the example capacitor bank assembly of FIG. 1.
Figure 18:
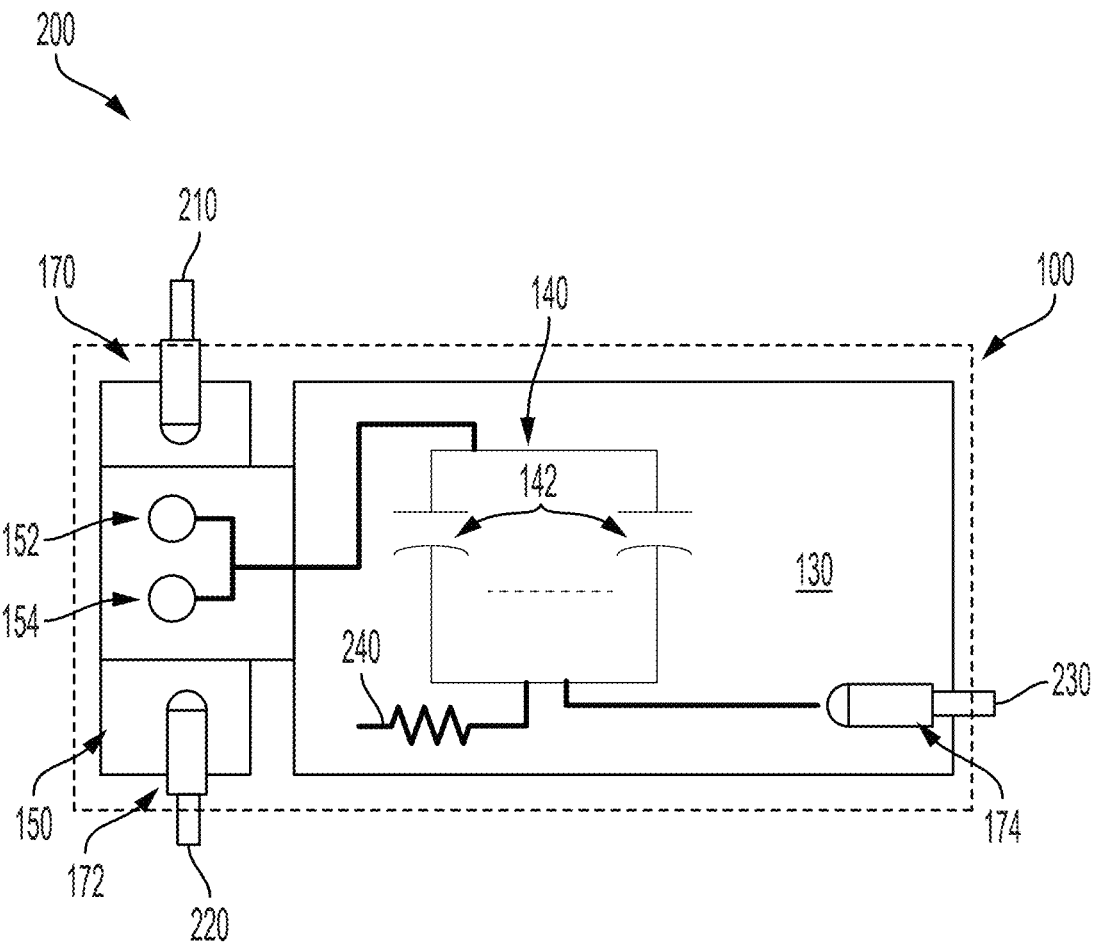
FIG. 18 illustrates a circuit diagram corresponding to the example system of FIG. 17.

FIG. 17 illustrates a block diagram of a system 200, and FIG. 18 illustrates a circuit diagram corresponding to the system 200. The system 200 includes an embodiment of the capacitor bank assembly 100. For purposes of simplicity, only the internal assembly 103 of the capacitor bank assembly 100 is depicted in FIG. 18. The internal assembly 103 includes components coupled to the power source 210, the output device 220, and the return/ground 230, respectively. As described in detail above, the internal assembly 103 includes the capacitor bank 140 having a plurality of the capacitors 142 connected (e.g., coupled, etc.) in parallel to the circuit board 130. The capacitor bank 140 is electrically or physically coupled to the busbar 150 through the circuit board 130, for example. The busbar 150 includes the input terminal 152 and the output terminal 154. In this regard, the system 200 includes the power source 210 (e.g., a 48 V DC supply) electrically connected to the input connector 170. The system 200 further includes the output device 220 electrically connected to the output connector 172. The output device 220 may be any suitable devices, such as an HCU described herein. In addition, the input connector 170 is further electrically or physically coupled to the input terminal 152, and the output connector 174 is further electrically or physically coupled to the output terminal 154.

In some embodiments, the internal assembly 103 further includes a discharge resistor 240. The capacitor bank 140 is further electrically or physically coupled to the discharge resistor 240. The discharge resistor 240 may be electrically or physically coupled to the circuit board 130. Since the capacitors 142 are charged when the vehicle is in operation, any stored charges on the capacitors 142 after the vehicle is turned off is then discharged from the capacitors 142 to the discharge resistor 240. In this regard, the discharge resistor 240 is configured to safely discharge the capacitor bank 140 by means of dissipation of heat.

Furthermore, in the depicted example embodiment, the circuit board 130 includes four metallization layers. Two of the metallization layers are each configured to provide conductive traces (e.g., interconnect structures, etc.) for coupling the capacitor bank 140 to the power source 210 (e.g., via the busbar 150 and the input connector 170). Two of the metallization layers are each configured to provide conductive traces (e.g., interconnect structures, etc.) for coupling the capacitor bank 140 to the return/ground 230 (e.g., via the return/ground connector 174).

III. Configuration of Example Embodiments

While this specification contains many specific implementation details, these should not be construed as limitations on the scope of what may be claimed but rather as descriptions of features specific to particular implementations. Certain features described in this specification in the context of separate implementations can also be implemented in combination in a single implementation. Conversely, various features described in the context of a single implementation can also be implemented in multiple implementations separately or in any suitable subcombination. Moreover, although features may be described as acting in certain combinations and even initially claimed as such, one or more features from a claimed combination can, in some cases, be excised from the combination, and the claimed combination may be directed to a subcombination or variation of a subcombination.

As utilized herein, the terms "substantially," "generally," "approximately," and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

The term "coupled" and the like, as used herein, mean the joining of two components directly or indirectly to one another. Such joining may be stationary (e.g., permanent) or moveable (e.g., removable or releasable). Such joining may be achieved with the two components or the two components and any additional intermediate components being integrally formed as a single unitary body with one another, with the two components, or with the two components and any additional intermediate components being attached to one another.

The terms "fluidly coupled to" and the like, as used herein, mean the two components or objects have a pathway formed between the two components or objects in which a fluid, such as air, exhaust, liquid reductant, gaseous reductant, aqueous reductant, gaseous ammonia, etc., may flow, either with or without intervening components or objects. Examples of fluid couplings or configurations for enabling fluid communication may include piping, channels, or any other suitable components for enabling the flow of a fluid from one component or object to another.

It is important to note that the construction and arrangement of the various systems shown in the various example implementations is illustrative only and not restrictive in character. All changes and modifications that come within the spirit and/or scope of the described implementations are desired to be protected. It should be understood that some features may not be necessary, and implementations lacking the various features may be contemplated as within the scope of the disclosure, the scope being defined by the claims that follow. When the language "a portion" is used, the item can include a portion and/or the entire item unless specifically stated to the contrary.

Also, the term "or" is used, in the context of a list of elements, in its inclusive sense (and not in its exclusive sense) so that when used to connect a list of elements, the term "or" means one, some, or all of the elements in the list. Conjunctive language such as the phrase "at least one of X, Y, and Z," unless specifically stated otherwise, is otherwise understood with the context as used in general to convey that an item, term, etc. may be either X, Y, Z, X and Y, X and Z, Y and Z, or X, Y, and Z (i.e., any combination of X, Y, and Z). Thus, such conjunctive language is not generally intended to imply that certain embodiments require at least one of X, at least one of Y, and at least one of Z to each be present, unless otherwise indicated.

Additionally, the use of ranges of values (e.g., W1 to W2, etc.) herein are inclusive of their maximum values and minimum values (e.g., W1 to W2 includes W1 and includes W2, etc.), unless otherwise indicated. Furthermore, a range of values (e.g., W1 to W2, etc.) does not necessarily require the inclusion of intermediate values within the range of values (e.g., W1 to W2 can include only W1 and W2, etc.), unless otherwise indicated.

What is claimed is:

1. A capacitor bank assembly comprising:
   a housing assembly comprising:
      an upper cover defining a cavity, and
      a lower cover below the upper cover in a first direction, the lower cover comprising:
         a base plate removably coupled to the upper cover,
         a first protrusion extending from the base plate in the first direction towards the upper cover, the first protrusion having a first protrusion upper surface, and
         a second protrusion extending from the base plate in the first direction towards the upper cover, the second protrusion having a second protrusion upper surface;
   an internal assembly disposed between the upper cover and the lower cover, the internal assembly comprising:
      a circuit board removably coupled to the upper cover and extending over the first protrusion and the second protrusion, and
      a plurality of capacitors electrically connected to the circuit board in parallel, each of the capacitors extending from the circuit board in the first direction, at least a portion of each of the capacitors extending within the cavity;

a first thermally conductive layer disposed between the circuit board and the first protrusion upper surface; and a second thermally conductive layer disposed between the circuit board and the second protrusion upper surface.

2. The capacitor bank assembly of claim 1, wherein the upper cover further comprises:

a base portion having a first upper surface and first lateral surfaces, and a raised portion extending in the first direction from a portion of the first upper surface, the raised portion comprising a second upper surface and a second lateral surface, the raised portion defining the cavity.

3. The capacitor bank assembly of claim 2, wherein the second lateral surface comprises a plurality of curved portions, each of the curved portions configured to contact a lateral surface of one of the capacitors.

4. The capacitor bank assembly of claim 3, wherein the first lateral surfaces are planar.

5. The capacitor bank assembly of claim 2, wherein the upper cover further comprises a support pin integrally formed with the raised portion.

6. The capacitor bank assembly of claim 5, wherein:

the support pin comprises:

an upper portion extending from the raised portion, a lower portion extending from the upper portion towards the capacitors, the lower portion coupled to the circuit board using a fastener, and a plurality of ridges extending radially from the upper portion, and an adjacent pair of the ridges is configured contact one of the capacitors.

7. The capacitor bank assembly of claim 2, further comprising:

a plurality of lower buffer layers each configured to couple one of the capacitors to the circuit board; and a plurality of upper buffer layers each configured to couple one of the capacitors to the raised portion.

8. The capacitor bank assembly of claim 1, wherein:

the internal assembly further comprises a busbar electrically connected to the circuit board, the busbar comprising an input terminal and an output terminal, and the capacitor bank assembly further comprises:

an input connector electrically connected to the input terminal, the input connector removably coupling the upper cover to the circuit board, and an output connector electrically connected to the output terminal, the output connector removably coupling the upper cover to the circuit board.

9. The capacitor bank assembly of claim 8, wherein the busbar extends lengthwise in a second direction perpendicular to the first direction such that the input terminal and the output terminal are separated from one another in the second direction.

10. The capacitor bank assembly of claim 8, wherein:

the first protrusion is oriented lengthwise in a second direction perpendicular to the first direction and separated from the busbar in a third direction perpendicular to both the first direction and the second direction, and the second protrusion is oriented lengthwise in a fourth direction and separated from the first protrusion in the third direction, the fourth direction being angled with respect to the second direction.

11. A system comprising the capacitor bank assembly of claim 8, the system further comprising:

a power source electrically connected to the input connector; and an output device electrically connected to the output connector.

12. The capacitor bank assembly of claim 1, wherein:

the first thermally conductive layer is in contact with the circuit board and the first protrusion upper surface and facilitates movement of the circuit board relative to the first protrusion; and the second thermally conductive layer is in contact with the circuit board and the second protrusion upper surface and facilitates movement of the circuit board relative to the second protrusion.

13. The capacitor bank assembly of claim 12, wherein the first thermally conductive layer and the second thermally conductive layer are made from a thermal paste.

14. The capacitor bank assembly of claim 1, wherein the first protrusion and the second protrusion are integrally formed with the base plate.

15. The capacitor bank assembly of claim 1, wherein:

the upper cover comprises a plurality of mounting feet, and each of the mounting feet comprises a protruding portion that extends past an edge of the base plate in the first direction.

16. A capacitor bank assembly comprising:

a housing assembly comprising:

an upper cover comprising:

a base portion having a first upper surface and first lateral surfaces, and a raised portion extending in a first direction from a portion of the first upper surface, the raised portion defining a cavity, and a lower cover comprising a base plate removably coupled to the upper cover; and an internal assembly disposed between the upper cover and the lower cover, the internal assembly comprising:

a circuit board interposed between the upper cover and the lower cover in the first direction, and a plurality of capacitors electrically connected to the circuit board in parallel, each of the capacitors coupled to the circuit board and extending from the circuit board in the first direction, at least a portion of each of the capacitors extending within the cavity.

17. The capacitor bank assembly of claim 16, wherein:

the raised portion comprises a second upper surface and a second lateral surface, and the second lateral surface comprises a plurality of curved portions, each of the curved portions configured to contact a lateral surface of one of the capacitors.

18. The capacitor bank assembly of claim 17, wherein the first lateral surfaces are planar.

19. The capacitor bank assembly of claim 16, wherein:

the upper cover further comprises a support pin integrally formed with the raised portion, and the support pin comprises:

a lower portion coupled to the circuit board using a fastener, an upper portion extending between the raised portion and the lower portion, and a plurality of ridges extending radially from the upper portion, an adjacent pair of the ridges configured to contact a lateral surface of one of the capacitors.

20. The capacitor bank assembly of claim 19, wherein:

the upper portion has a first diameter measured in a plane of an upper surface of the raised portion, the lower portion has a second diameter that is less than the first diameter, and a width of each of the ridges decreases from the upper portion towards the lower portion in the first direction.

21. The capacitor bank assembly of claim 16, wherein:

the internal assembly further comprises a busbar electrically connected to the circuit board, the busbar comprising an input terminal and an output terminal, and the capacitor bank assembly further comprises:

an input connector electrically connected to the input terminal, the input connector removably coupling the upper cover to the circuit board, and an output connector electrically connected to the output terminal, the output connector removably coupling the upper cover to the circuit board.

22. A system comprising the capacitor bank assembly of claim 21, the system further comprising:

a power source electrically connected to the input connector; and an output device electrically connected to the output connector.

23. The system of claim 22, wherein the output device is a heater control unit.

24. The capacitor bank assembly of claim 16, wherein: the lower cover further comprises:

a first protrusion integrally formed with and extending from the base plate in the first direction towards the upper cover, the first protrusion having a first protrusion upper surface, and a second protrusion integrally formed with and extending from the base plate in the first direction towards the upper cover the second protrusion having a second protrusion upper surface, and the circuit board extends over the first protrusion and the second protrusion.

25. The capacitor bank assembly of claim 24, further comprising:

the first thermally conductive layer is in contact with the circuit board and the first protrusion upper surface and facilitates movement of the circuit board relative to the first protrusion; and the second thermally conductive layer is in contact with the circuit board and the second protrusion upper surface and facilitates movement of the circuit board relative to the second protrusion.

26. The capacitor bank assembly of claim 16, wherein the capacitor bank assembly further comprises:

a plurality of lower buffer layers each configured to couple one of the capacitors to the circuit board, the lower buffer layer made from a first adhesive sealant, and a plurality of upper buffer layers each configured to couple one of the capacitors to the raised portion, the upper buffer layer made from a second adhesive sealant that is different from the first adhesive sealant.

27. The capacitor bank assembly of claim 16, wherein:

the base portion comprises a plurality of mounting feet, and each of the mounting feet comprises a protruding portion that extends past an edge of the base plate in the first direction.

* * * * *